(12) United States Patent
Cho et al.

(10) Patent No.: US 12,211,553 B2
(45) Date of Patent: Jan. 28, 2025

(54) STORAGE SYSTEM AND OPERATING METHOD OF STORAGE CONTROLLER

(71) Applicant: SAMSUNG ELECTRONICS CO., LTD., Suwon-si (KR)

(72) Inventors: Won Hee Cho, Seoul (KR); Ji Sung Byun, Suwon-si (KR); Dong Eun Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 80 days.

(21) Appl. No.: 17/939,021

(22) Filed: Sep. 7, 2022

(65) Prior Publication Data

US 2023/0154540 A1 May 18, 2023

(30) Foreign Application Priority Data

Nov. 15, 2021 (KR) .......................... 10-2021-0156783
Apr. 21, 2022 (KR) .......................... 10-2022-0049653

(51) Int. Cl.
| | | |
|---|---|---|
| G11C 11/00 | (2006.01) | |
| G06N 20/00 | (2019.01) | |
| G11C 16/08 | (2006.01) | |
| G11C 16/10 | (2006.01) | |
| G11C 16/34 | (2006.01) | |

(52) U.S. Cl.
CPC ........... *G11C 16/102* (2013.01); *G06N 20/00* (2019.01); *G11C 16/08* (2013.01); *G11C 16/3495* (2013.01)

(58) Field of Classification Search
CPC ... G11C 16/102; G11C 16/08; G11C 16/3495; G06N 20/00
See application file for complete search history.

(56) References Cited

U.S. PATENT DOCUMENTS

| | | |
|---|---|---|
| 7,334,080 B2 | 2/2008 | Takase et al. |
| 7,477,550 B2 | 1/2009 | Son et al. |
| 8,041,882 B2 | 10/2011 | Jachalsky et al. |
| (Continued) | | |

FOREIGN PATENT DOCUMENTS

| | | |
|---|---|---|
| EP | 3828891 A1 | 6/2021 |
| KR | 20110078728 A | 7/2011 |
| (Continued) | | |

OTHER PUBLICATIONS

European Search Report Dated Mar. 17, 2023, Cited in Corresponding Application No. EP 22 198 023.8.

(Continued)

*Primary Examiner* — Pho M Luu
(74) *Attorney, Agent, or Firm* — Fish & Richardson P.C.

(57) ABSTRACT

A storage system includes a non-volatile memory (NVM) device, having a memory cell array, and a storage controller. The storage controller receives a write command and data from a host and controls the NVM device to write the data in the memory cell array. Additionally, the storage controller determines a memory region of the memory cell array in which the data will be written, clusters a plurality of word lines into a plurality of groups on the basis of feature information of the plurality of word lines, rearranges an access order in units of groups according to the feature information, and accesses the word lines in the rearranged order to write the data in the memory region.

20 Claims, 18 Drawing Sheets

(56) References Cited

U.S. PATENT DOCUMENTS

| | | | |
|---|---|---|---|
| 8,825,942 B2* | 9/2014 | Ye | G06F 3/064 |
| | | | 707/693 |
| 10,713,163 B2* | 7/2020 | Desai | G06F 3/0644 |
| 10,761,780 B2* | 9/2020 | Miura | G06F 3/0604 |
| 2010/0042777 A1 | 2/2010 | Tsuji | |
| 2013/0268724 A1 | 10/2013 | Seo et al. | |
| 2018/0150224 A1 | 5/2018 | You | |

FOREIGN PATENT DOCUMENTS

| KR | 20170028152 A | 3/2017 |
|---|---|---|
| KR | 1020170072388 A | 6/2017 |
| KR | 20190043022 A | 4/2019 |
| KR | 20190110869 A | 10/2019 |
| KR | 1020200018999 A | 2/2020 |
| KR | 20210038290 A | 4/2021 |
| KR | 20210066630 A | 6/2021 |

OTHER PUBLICATIONS

European First Office Action Dated Mar. 30, 2023, Cited in Corresponding Application No. EP 22 198 023.8.
Korean Office Action Dated Jan. 11, 2023, Cited in Corresponding Korean Application No. KR 10-2022-0049653.
Office Action in European Appln. No. 22198023.8, mailed on Nov. 27, 2024, 7 pages.

* cited by examiner

STORAGE SYSTEM AND OPERATING METHOD OF STORAGE CONTROLLER

This application claims priority from Korean Patent Application No. 10-2021-0156783 filed on Nov. 15, 2021, and No. 10-2022-0049653 filed on Apr. 21, 2022, in the Korean Intellectual Property Office, the disclosures of which are incorporated herein by reference in their entireties.

BACKGROUND

1. Field of the Disclosure

The present disclosure relates to a storage system that performs a write operation on a non-volatile memory device.

2. Description of the Related Art

These days, storage devices including non-volatile memories are widely used. Examples of the storage devices include a solid state drive (SSD), a non-volatile memory express (NVMe), an embedded multi-media card (eMMC), a universal flash storage (UFS), etc. The above storage devices have no mechanical driving part and, thus, have advantages of excellent stability and durability, a very high information access rate, and low power consumption. As electronic circuits currently apply to various types of systems, such as cars, aircrafts, drones, etc., as well as electronic systems, such as a laptop computer, storage devices are also used in various types of systems.

With an increase in the generation and block size of non-volatile memory devices, e.g., a NAND memory device, word lines in one block show different features.

When a storage controller writes data on a non-volatile memory device, a buffer memory is used. In this case, the buffer memory is operated on the basis of a word line having the worst feature, among word lines having different features, and accordingly the write operation takes a long time, which is problematic.

SUMMARY

Aspects of the present disclosure provide a storage system having improved operation performance.

Aspects of the present disclosure also provide a storage system of which a write operation time is improved by adjusting the order of writing according to word line features. Aspects of the present disclosure also provide a storage system of which efficiency in using a buffer memory is improved by adjusting the order of writing according to word line features.

One embodiment of the present disclosure provides a storage system comprising a non-volatile memory (NVM) device including a memory cell array and a storage controller configured to receive a write command and data from a host and control the NVM device to write the data in the memory cell array. The storage controller determines a memory region of the memory cell array in which the data will be written, clusters a plurality of word lines into a plurality of groups on the basis of feature information of the plurality of word lines, rearranges an access order in units of groups according to the feature information, and accesses the word lines in the rearranged order to write the data in the memory region.

Another embodiment of the present disclosure provides a storage system comprising a non-volatile memory (NVM) device including a memory cell array connected to a plurality of word lines and a storage controller including a mitigator. The mitigator is configured to receive a write command and data from a host, rearrange an order of accessing word lines belonging to a memory region in which the data will be written in units of groups, and output word line addresses in the rearranged order of groups and control the NVM device to write the data. The mitigator comprises a feature table configured to store metric information and group information of each of the plurality of word lines, a block selector configured to select metric information and group information corresponding to the word lines of the memory region and rearrange the order of accessing the word lines of the memory region in units of the groups according to the metric information, and a selection address issuer configured to issue addresses of the rearranged access order to the NVM device.

Other embodiment of the present disclosure provides an operating method of a storage controller. The method includes receiving a write command and data from a host, extracting prestored metric information corresponding to a word line for a memory region of a non-volatile memory (NVM) device in which the data will be written, accessing the memory region in an order of word lines, which are rearranged in units of groups on the basis of the extracted metric information, to write the data when acknowledgment (ACK) information is received from the NVM device, and calculating actual metric information from the ACK information to update the prestored metric information.

Other embodiment of the present disclosure provides a storage system comprising a nonvolatile memory cell array, and a storage controller that addresses the nonvolatile memory cell array through word lines, wherein the storage controller, assigns the word lines into groups based on feature information, rearranges an access order of the groups as a rearranged access order based on the feature information, and accesses the word lines in the rearranged access order during a write operation performed on the nonvolatile memory cell array.

It should be noted that objects of the present disclosure are not limited to the above-described objects, and other objects which have not been described will be apparent to those skilled in the art from the following descriptions.

DETAILED DESCRIPTION OF THE EMBODIMENTS

Hereinafter, a storage device according to some exemplary embodiments of the present disclosure will be described with reference to FIGS. 1 to 18.

Figure 1:
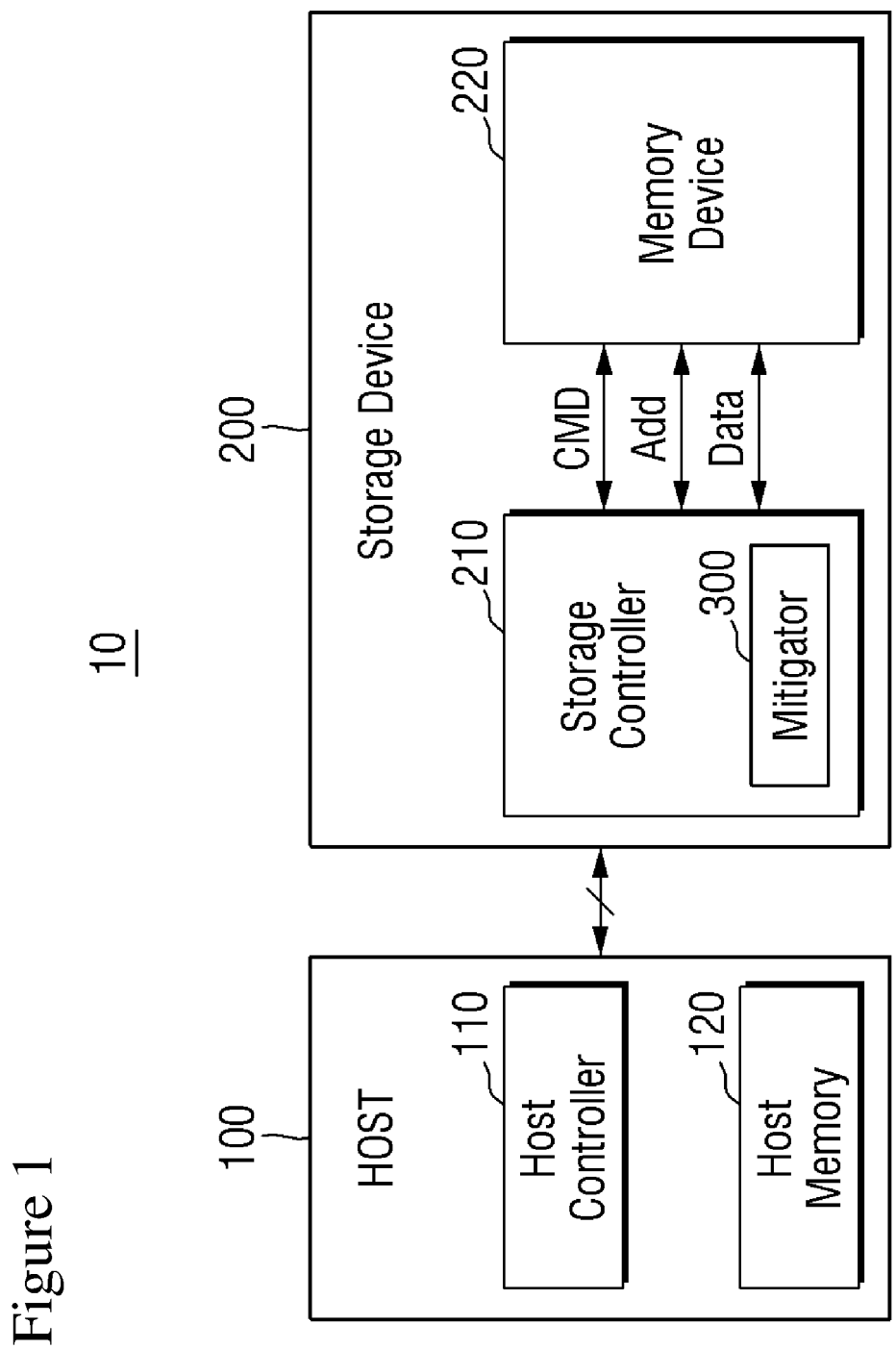
FIG. 1 is a block diagram of a host-storage system according to an exemplary embodiment of the present disclosure.
Figure 2:
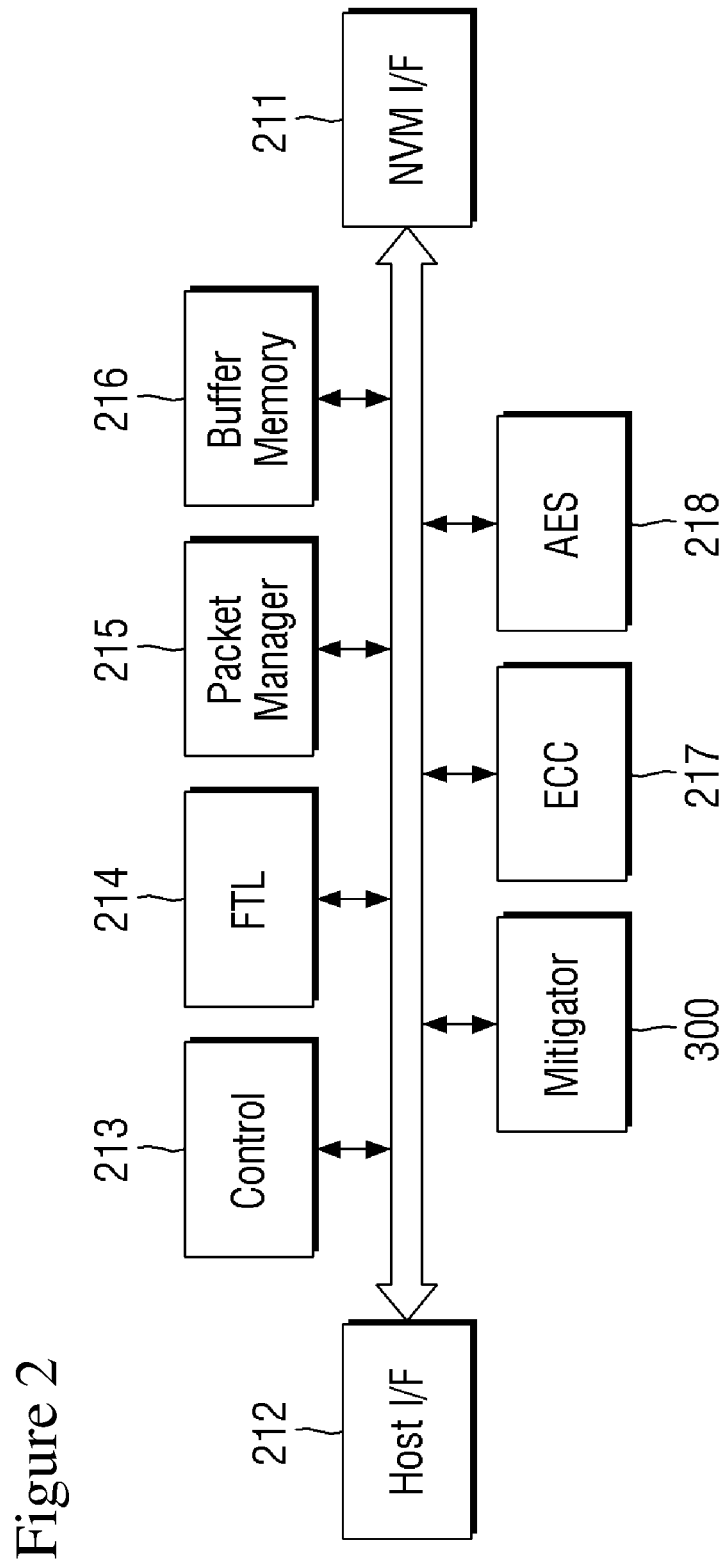
FIG. 2 is a block diagram of a storage system according to some embodiments.

FIG. 1 is a block diagram of a host-storage system according to an exemplary embodiment of the present disclosure. FIG. 2 is a block diagram of a storage system according to some embodiments.

A host-storage system 10 may include a host 100 and a storage device 200. The storage device 200 may include a storage controller 210 and a non-volatile memory (NVM) device 220. According to an exemplary embodiment of the present disclosure, the host 100 may include a host controller 110 and a host memory 120. The host memory 120 may function as a host buffer memory for temporarily storing data to be transmitted to the storage device 200 or data transmitted from the storage device 200.

The storage device 200 may include storage media for storing data at a request from the host 100. As an example, the storage device 200 may include at least one of a solid state drive (SSD), an embedded memory, and a detachable external memory. When the storage device 200 is an SSD, the storage device 200 may be a device complying with a non-volatile memory express (NVMe) standard. When the storage device 200 is an embedded memory or an external memory, the storage device 200 may be a device complying with a universal flash storage (UFS) or an embedded multimedia card (eMMC) standard. Each of the host 100 and the storage device 200 may generate and transmit a packet according to the adopted standard protocol.

When the NVM device 220 of the storage device 200 includes a flash memory, the flash memory may include a two-dimensional NAND memory array or a three-dimensional (3D) (or vertical) NAND (VNAND) memory array. As another example, the storage device 200 may include various other types of NVMs. For example, the storage device 200 may be a magnetic random access memory (MRAM), a spin-transfer torque MRAM, a conductive bridging random access memory (CBRAM), a ferroelectric random access memory (FeRAM), a phase-change random access memory (PRAM), a resistive random access memory (RRAM), and various other types of memories.

According to an embodiment, the host controller 110 and the host memory 120 may be implemented as separate semiconductor chips. Alternatively, in some embodiments, the host controller 110 and the host memory 120 may be integrated in the same semiconductor chip. As an example, the host controller 110 may be any one of a plurality of modules provided in an application processor and the application processor may be implemented as a system on chip (SoC). Also, the host memory 120 may be an embedded memory provided in the application processor or an NVM or memory module disposed outside the application processor.

The host controller 110 may manage an operation of storing data (e.g., write data) of the host memory 120 in the NVM device 220 or storing data (e.g., read data) of the NVM device 220 in the host memory 120.

Referring to FIG. 2, the storage controller 210 may include a host interface 212, a memory interface 211, and a controller 213. Also, the storage controller 210 may further include a flash translation layer (FTL) 214, a packet manager 215, a buffer memory 216, an error correction code (ECC) engine 217, an advanced encryption standard engine 218, and a mitigator 300. The storage controller 210 may further include a working memory (not shown) into which the FTL 214 is loaded, and when the controller 213 executes the FTL 214, data write and read operations for the NVM device 220 may be controlled.

The host interface 212 may transmit or receive packets to or from the host 100. Packets transmitted from the host 100 to the host interface 212 may include a command, data to be written in the NVM device 220, etc., and packets transmitted from the host interface 212 to the host 100 may include a response to the command, data read from the NVM device 220, etc. The memory interface 211 may transmit the data to be written in the NVM device 220 to the NVM device 220 or receive the data read from the NVM device 220. The memory interface 211 may be implemented to comply with a standard protocol, such as Toggle or ONFI.

The FTL 214 may perform several functions, such as address mapping, wear-leveling, and garbage collection. Address mapping is an operation of changing a logical address received from the host 100 into a physical address used for storing data in the NVM device 220. Wear-leveling is a technique for preventing excessive degradation of a specific block by causing blocks in the NVM device 220 to be evenly used. For example, wear-leveling may be implemented through a firmware technique for balancing erase counts of physical blocks. Garbage collection is a technique for ensuring an available capacity in the NVM device 220 by copying valid data of a block to a new block and then erasing the existing block.

The packet manager 215 may generate a packet according to a protocol of an interface negotiated with the host 100 or parse various information from a packet received from the host 100. Also, the buffer memory 216 may temporarily store the data to be written in the NVM device 220 or the data read from the NVM device 220. The buffer memory 216 may be a component provided in the storage controller 210 but may also be disposed outside the storage controller 210.

The ECC engine 217 may perform an error detection and correction function on the read data read from the NVM device 220. More specifically, the ECC engine 217 may generate parity bits for the write data to be written in the NVM device 220 and the generated parity bits may be stored in the NVM device 220 together with the write data. When data is read from the NVM device 220, the ECC engine 217 may correct an error of the read data using parity bits, which are read from the NVM device 220 together with the read data, and output the read data of which the error has been corrected.

The AES engine 218 may perform at least one of an encryption operation and a decryption operation on data input to the storage controller 210 using a symmetric-key algorithm.

When a write command and data to be written is received from the host 100 according to some embodiments, the mitigator 300 determines a memory region of the NVM device 220 to be accessed according to the write command, rearranges an order of word lines for writing in units of groups on the basis of feature information of word lines belonging to the memory region to be accessed, and writes the data through the word lines of the rearranged group.

The mitigator 300 may cluster a plurality of word lines into groups. The mitigator 300 may cluster a plurality of word lines, which have metric values within a preset standard deviation range and correspond to physically consecutive addresses, into one group. For example, one group may include k (k is a natural number of three or more) word lines having physically consecutive addresses and each of the k word lines may have a metric value within the preset standard deviation range on the basis of the average metric value of the k word lines.

According to some embodiments, the mitigator 300 updates information regarding features of the word lines on the basis of acknowledgment (ACK) information which is received after the data is written in the NVM device 220.

According to some embodiments, as feature information of word lines, metric information of the word lines is classified into groups and stored in a feature table. For example, as feature information, metric information of word lines is learned in advance through machine learning, classified into groups, and stored in the feature table. The mitigator 300 updates metric information of each word line, which is changed according to the life span of the NVM device 220 on the basis of subsequent ACK information received from the NVM device 220, and stores the updated metric information in the feature table.

Figure 3:
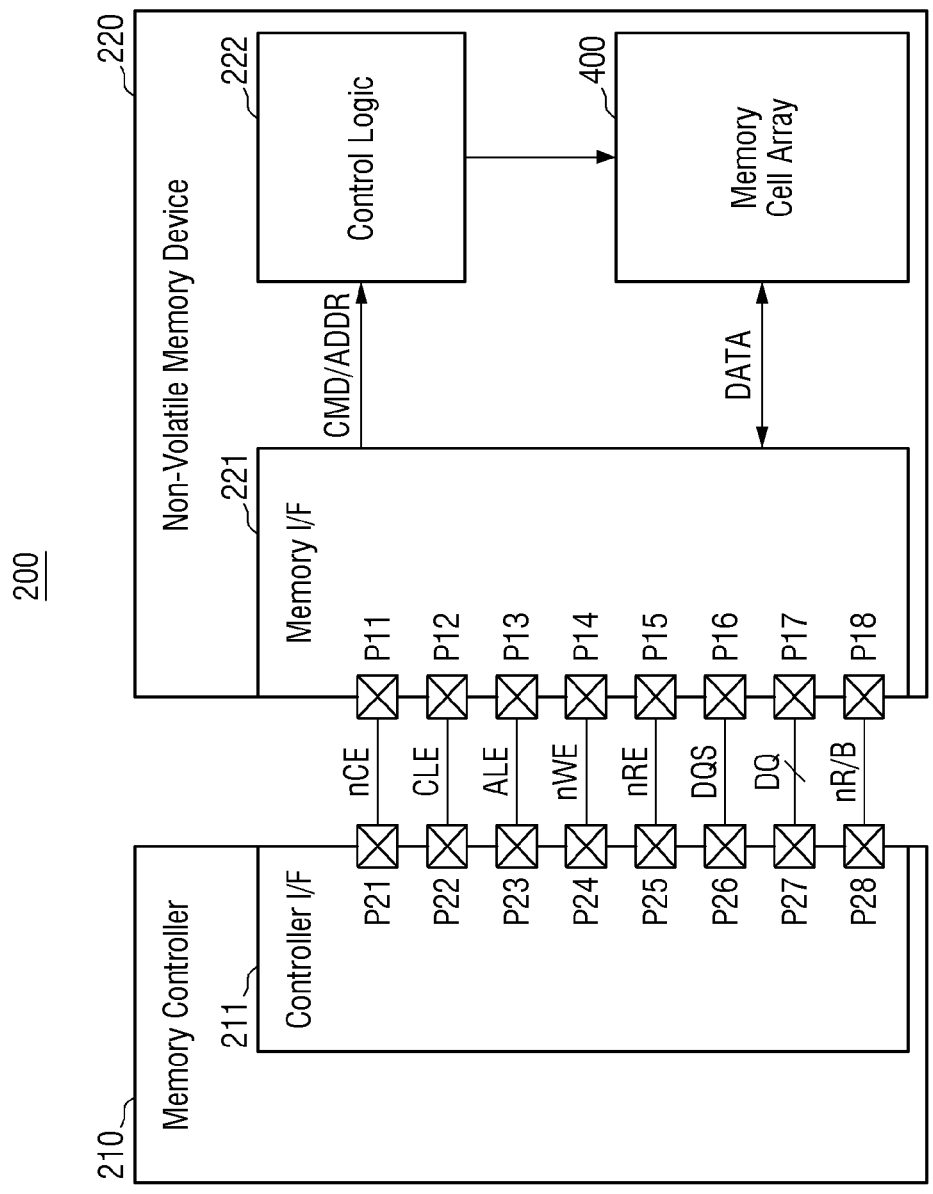
FIG. 3 is a block diagram of a memory system according to one embodiment of the present disclosure.

FIG. 3 is a block diagram of a memory system according to one embodiment of the present disclosure. Referring to FIG. 3, a storage system 200 may include an NVM device 220 and a storage controller 210.

The NVM device 220 may include first to eighth pins P11 to P18, a memory interface circuit 221, a control logic circuit 222, and a memory cell array 400.

The memory interface circuit 221 may receive a chip enable signal nCE from the storage controller 210 through the first pin P11. The memory interface circuit 221 may transmit or receive signals to or from the storage controller 210 through the second to eighth pins P12 to P18 according to the chip enable signal nCE. For example, when the chip enable signal nCE is in an enable state (e.g., a low level), the memory interface circuit 221 may transmit or receive signals to or from the storage controller 210 through the second to eighth pins P12 to P18.

The memory interface circuit 221 may receive a command latch enable signal CLE, an address latch enable signal ALE, and a write enable signal nWE through the second to fourth pins P12 to P14. The memory interface circuit 221 may receive a data signal DQ from the storage controller 210 through the seventh pin P17 or transmit the data signal DQ to the storage controller 210. A command CMD, an address ADDR, and data DATA may be transmitted through the data signal DQ. For example, the data signal DQ may be transmitted through a plurality of data signal lines. In this case, the seventh pin P17 may include a plurality of pins corresponding to a plurality of data signals.

The memory interface circuit 221 may acquire the command CMD from the data signal DQ, which is received in an enable period (e.g., a high-level state) of the command latch enable signal CLE, on the basis of toggle timings of the write enable signal nWE. The memory interface circuit 221 may acquire the address ADDR from the data signal DQ, which is received in an enable period (e.g., a high-level state) of the address latch enable signal ALE, on the basis of the toggle timings of the write enable signal nWE.

In an exemplary embodiment, the write enable signal nWE is maintained in a static state (e.g., a high level of low level) and toggled between the high level and the low level. For example, the write enable signal nWE may be toggled in a period in which the command CMD or the address ADDR is transmitted. Accordingly, the memory interface circuit 221 may acquire the command CMD or the address ADDR on the basis of the toggle timings of the write enable signal nWE.

The memory interface circuit 221 may receive a read enable signal nRE from the storage controller 210 through the fifth pin P15. Through the sixth pin P16, the memory interface circuit 221 may receive a data strobe signal DQS from the storage controller 210 or transmit the data strobe signal DQS to the storage controller 210.

In an operation of the NVM device 220 outputting data DATA, the memory interface circuit 221 may receive the toggling read enable signal nRE through the fifth pin P15 before outputting the data DATA. The memory interface circuit 221 may generate the toggling data strobe signal DQS on the basis of the toggling of the read enable signal nRE. For example, the memory interface circuit 221 may generate the data strobe signal DQS that starts toggling after a predetermined delay (e.g., tDQSRE) from a toggling start time of the read enable signal nRE. The memory interface circuit 221 may transmit the data signal DQ including the data DATA on the basis of a toggle timing of the data strobe signal DQS. Accordingly, the data DATA may be transmitted to the storage controller 210 at the toggle timing of the data strobe signal DQS.

In an operation of inputting the data DATA to the NVM device 220, when the data signal DQ including the data DATA is received from the storage controller 210, the memory interface circuit 221 may receive the toggling data strobe signal DQS together with the data DATA from the storage controller 210. The memory interface circuit 221 may acquire the data DATA from the data signal DQ on the basis of the toggle timing of the data strobe signal DQS. For example, the memory interface circuit 221 may acquire the data DATA by sampling the data signal DQ at rising edges and falling edges of the data strobe signal DQS.

The memory interface circuit 221 may transmit a ready/busy output signal nR/B to the storage controller 210 through the eighth pin P18. The memory interface circuit 221 may transmit state information of the NVM device 220 to the storage controller 210 through the ready/busy output signal nR/B. When the NVM device 220 is in a busy state (i.e., when internal operations of the NVM device 220 are underway), the memory interface circuit 221 may transmit the ready/busy output signal nR/B representing the busy state to the storage controller 210. When the NVM device 220 is in a ready state (i.e., when internal operations of the NVM device 220 are not underway or are finished), the memory interface circuit 221 may transmit the ready/busy output signal nR/B representing the ready state to the storage controller 210. For example, while the NVM device 220 reads the data DATA from the memory cell array 400 in response to a page read command, the memory interface circuit 221 may transmit the ready/busy output signal nR/B representing the busy state (e.g., the low level) to the storage controller 210. As another example, while the NVM device 220 programs the data DATA into the memory cell array 400 in response to a program command, the memory interface circuit 221 may transmit the ready/busy output signal nR/B representing the busy state to the storage controller 210.

The control logic circuit 222 may control various operations of the NVM device 220 overall. The control logic circuit 222 may receive the command/address CMD/ADDR acquired from the memory interface circuit 221. The control logic circuit 222 may generate control signals for controlling other components of the NVM device 220 according to the received command/address CMD/ADDR. For example, the control logic circuit 222 may generate various control signals for programming the data DATA into the memory cell array 400 or reading the data DATA from the memory cell array 400.

The memory cell array 400 may store the data DATA acquired from the memory interface circuit 221 according to control of the control logic circuit 222. The memory cell array 400 may output the stored data DATA to the memory interface circuit 221 according to control of the control logic circuit 222.

The memory cell array 400 may include a plurality of memory cells. For example, the plurality of memory cells may be flash memory cells. However, the present disclosure is not limited thereto, and the memory cells may be RRAM cells, FeRAM cells, PRAM cells, thyristor random access memory (TRAM) cells, or MRAM cells. Embodiments of the present disclosure will be described below, centering on embodiments in which memory cells are NAND flash memory cells.

The storage controller 210 may include first to eighth pins P21 to P28 and the controller interface circuit 211. The first to eighth pins P21 to P28 may correspond to the first to eighth pins P11 to P18 of the NVM device 220.

The controller interface circuit 211 may transmit the chip enable signal nCE to the NVM device 220 through the first pin P21. The controller interface circuit 211 may transmit or receive signals to or from the NVM device 220, which is selected through the chip enable signal nCE, through the second to eighth pins P22 to P28.

The controller interface circuit 211 may transmit the command latch enable signal CLE, the address latch enable signal ALE, and the write enable signal nWE to the NVM device 220. Through the seventh pin P27, the controller interface circuit 211 may transmit the data signal DQ to the NVM device 220 or receive the data signal DQ from the NVM device 220.

The controller interface circuit 211 may transmit the data signal DQ including the command CMD or the address ADDR together with the toggling write enable signal nWE to the NVM device 220. In this case, addresses may be output in an order of word lines rearranged in units of groups on the basis of metric information.

The controller interface circuit 211 may transmit the data signal DQ including the command CMD to the NVM device 220 when transmitting the command latch enable signal CLE in the enable state and may transmit the data signal DQ including the address ADDR to the NVM device 220 when transmitting the address latch enable signal ALE in the enable state.

The controller interface circuit 211 may transmit the read enable signal nRE to the NVM device 220 through the fifth pin P25. Through the sixth pin P26, the controller interface circuit 211 may receive the data strobe signal DQS from the NVM device 220 or transmit the data strobe signal DQS to the NVM device 220.

In an operation of the NVM device 220 outputting the data DATA, the controller interface circuit 211 may generate the toggling read enable signal nRE and transmit the read enable signal nRE to the NVM 220. For example, the controller interface circuit 211 may generate the read enable signal nRE which changes from a fixed state (e.g., a high level or low level) to a toggle state before the data DATA is output. Accordingly, the toggling data strobe signal DQS may be generated by the NVM device 220 on the basis of the read enable signal nRE. The controller interface circuit 211 may receive the data signal DQ including the data DATA together with the toggling data strobe signal DQS from the NVM device 220. The controller interface circuit 211 may acquire the data DATA from the data signal DQ on the basis of the toggle timing of the data strobe signal DQS.

In an operation of inputting the data DATA to the NVM device 220, the controller interface circuit 211 may generate the toggling data strobe signal DQS. For example, the controller interface circuit 211 may generate the data strobe signal DQS which changes from a fixed state (e.g., a high level or low level) to a toggle state before transmitting the data DATA. The controller interface circuit 211 may transmit the data signal DQ including the data DATA to the NVM device 220 on the basis of toggle timings of the data strobe signal DQS.

The controller interface circuit 211 may receive the ready/busy output signal nR/B from the NVM device 220 through the eighth pin P28. The controller interface circuit 211 may determine state information of the NVM device 220 on the basis of the ready/busy output signal nR/B.

Figure 4:
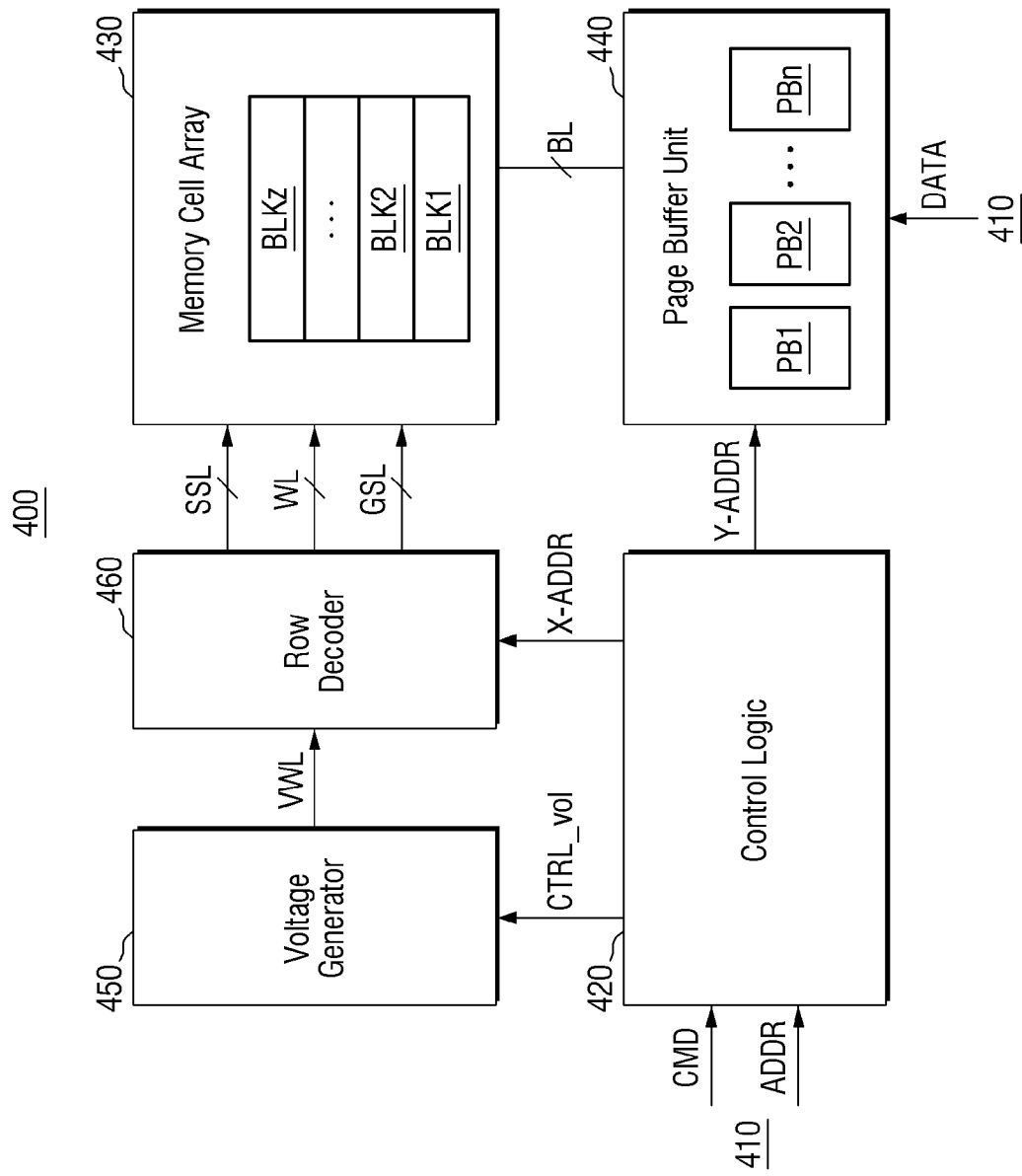
FIG. 4 is an exemplary block diagram of a memory device.

FIG. 4 is an exemplary block diagram of a memory device. Referring to FIG. 4, an NVM device 400 may include a control logic circuit 420, a memory cell array 430, a page buffer unit 440, a voltage generator 450, and a row decoder 460. Although not shown in FIG. 4, the NVM device 400 may further include a memory interface circuit 410 and additionally include a column logic, a pre-decoder, a temperature sensor, a command decoder, an address decoder, etc.

The control logic circuit 420 may control various operations of the NVM device 400 overall. The control logic circuit 420 may output various command signals in response to a command CMD and/or an address ADDR from a memory interface circuit 410. For example, the control logic circuit 420 may output a voltage control signal CTRL_vol, a row address X-ADDR, and a column address Y-ADDR.

The memory cell array 430 may include a plurality of memory blocks BLK1 to BLKz (z is a positive integer), and each of the memory blocks BLK1 to BLKz may include a plurality of memory cells. The memory cell array 430 may be connected to the page buffer unit 440 through bit lines BL and connected to the row decoder 460 through word lines WL, string selection lines SSL, and ground selection lines GSL.

In an exemplary embodiment, the memory cell array 430 may include a 3D memory cell array and the 3D memory cell array may include a plurality of NAND strings. Each of the NAND strings may include memory cells each connected to word lines which are vertically stacked on a substrate. U.S. Pat. Nos. 7,679,133, 8,553,466, 8,654,587, and 8,559,235, and US Patent Application No. 2011/0233648 are incorporated herein by reference. In an exemplary embodiment, the memory cell array 430 may include a 2D memory cell array and the 2D memory cell array may include a plurality of NAND strings disposed in row and column directions.

The page buffer unit 440 may include a plurality of page buffers PB1 to PBn (n is an integer equal to or greater than 3), and the plurality of page buffers PB1 to PBn may be connected to memory cells through a plurality of bit lines BL. The page buffer unit 440 may select at least one of the bit lines BL in response to the column address Y-ADDR. The page buffer unit 440 may operate as a write driver or a sense amplifier according to an operation mode. For example, during a program operation, the page buffer unit 440 may apply a bit-line voltage corresponding to data to be programmed to the selected bit line. During a read operation, the page buffer unit 440 may sense a current or voltage of the selected bit line to detect data stored in a memory cell.

The voltage generator 450 may generate various types of voltages for performing program, read, and erase operations on the basis of a voltage control signal CTRL_vol. For example, the voltage generator 450 may generate a program voltage, a read voltage, a program verification voltage, an erase voltage, etc. as a word line voltage $V_{WL}$.

The row decoder 460 may select one of the plurality of word lines WL in response to the row address X-ADDR and select one of the plurality of string selection lines SSL. For example, the row decoder 460 may apply the program voltage and the program verification voltage to the selected word line during a write operation and may apply the read voltage to the selected word line during a read operation.

Figure 5:
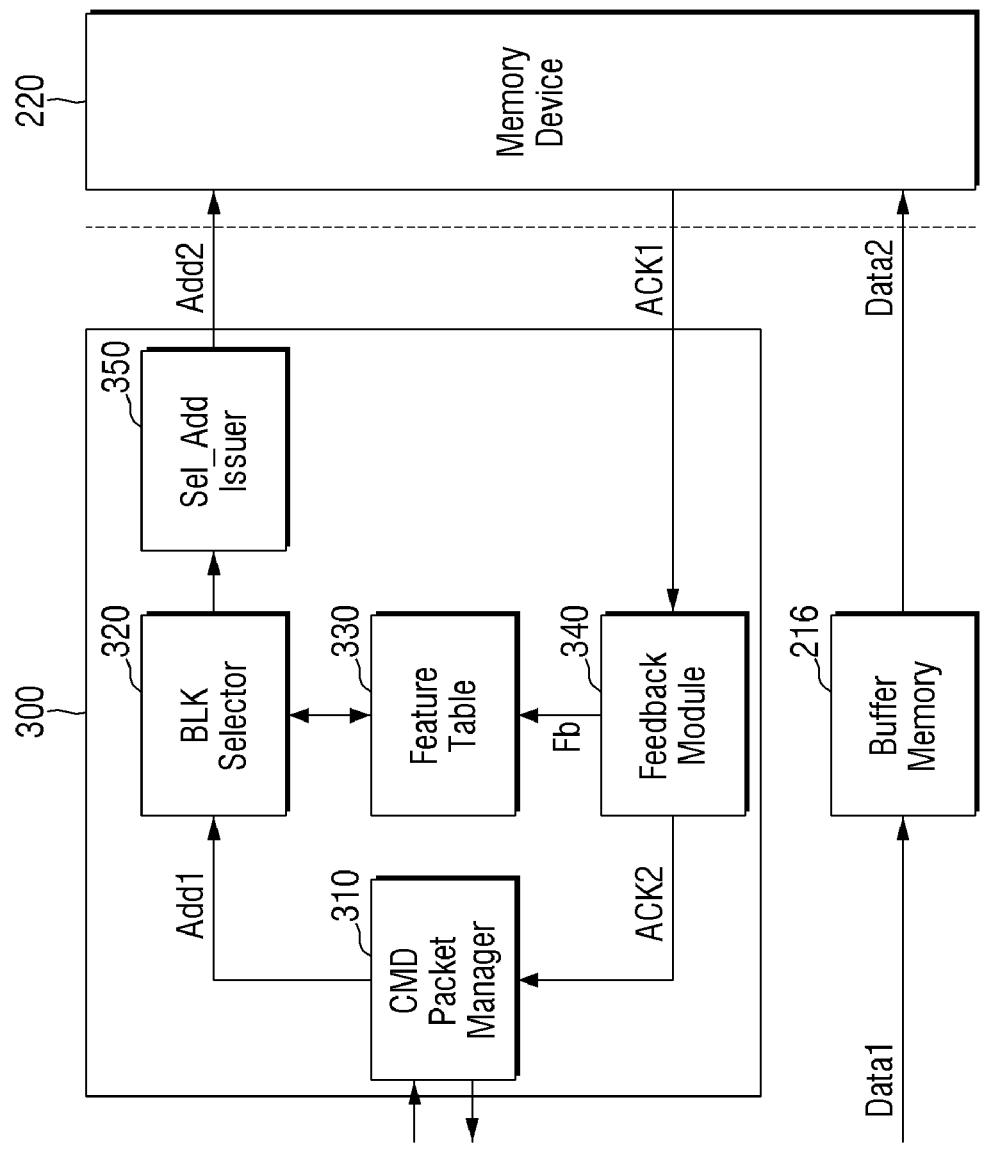
FIG. 5 is a block diagram showing a mitigator in detail according to some embodiments.

FIG. 5 is a block diagram showing a mitigator in detail according to some embodiments.

Referring to FIG. 5, the mitigator 300 includes a command packet manager 310, a block selector 320, a feature table 330, a feedback module 340, and a selection address issuer 350.

The command packet manager 310 receives a write command from the host 100 and transmits information Add on a memory region in which data will be written to the block selector 320. The information Add1 on the memory region may include, for example, a start address and an end address of the NVM device 220. When a write operation on the NVM device 220 is finished, the command packet manager 310 receives ACK1 and ACK2 information for the memory region of the NVM device 220 and notifies the host 100 that the write operation has been finished.

When an address of a memory region to be accessed is received from the command packet manager 310, the block selector 320 checks metric information of the memory region in the feature table 330. The block selector 320 rearranges an order of accessing word lines belonging to the memory region to be accessed according to the metric information. The block selector 320 may rearrange, for example, an order of accessing word lines in units of groups and output the rearranged order as access addresses Add2. For example, when the memory cell region of the NVM device 220 is divided into first to sixth groups, the block selector 320 rearranges an access order in units of groups, such as the fourth group, the second group, the fifth group, the second group, the first group, and the sixth group. However, word lines that are clustered into groups and reordered meet a write operation limitation (a program constraint) condition of the NVM device 220.

The feature table 330 may store variation feature information of the NVM device 220 according to some embodiments. The feature table 330 may learn, for example, feature information and store metric information of each word line as a learning result. The feature information may include metric information of at least one of features of the NVM device 220, for example, chip location information, block location information, information tPROG on a program time taken for a data write operation, information tR on a read time taken for a read operation, a program/erase (P/E) cycle, a process index, and wafer size information.

According to some embodiments, the feature table 330 may store group information indicating a group to which each word line belongs as information of grouping memory cells of the NVM device 220 into N groups. N is a natural number equal to or greater than two. The groups may be obtained by clustering M word lines that have consecutive physical addresses and similar metric values into one group. M is a natural number qual to or greater than three.

For example, when a word line $WL_x$ to a word line $WL_{x+N}$ have metric values within a preset standard deviation range, the word line $WL_x$ to the word line $WL_{x+N}$ are clustered into one group and the feature table 300 stores the group information in combination with metric information of the word lines. Grouping will be described in detail below with reference to FIG. 13.

The selection address issuer 350 issues access addresses Add2 in the rearranged order of accessing the word lines to the NVM device 220 according to some embodiments. In other words, the selection address issuer 350 issues access addresses Add2 in the rearranged order of groups.

The NVM device 220 activates the word lines in order of receiving the word lines from the selection address issuer 350 and writes data Data2 received from the buffer memory 216 to a memory cell belonging to the activated word line. The buffer memory 216 may receive data Data1 to be written from the host 100 and store the data Data1.

When the write operation is finished, the NVM device 220 transmits metric information of the write operation in the memory region as the ACK1 information. The feedback module 340 receives the ACK1 information from the NVM device 220 and updates the feature table 330 with feedback information Fb on the basis of the metric information of the memory region acquired from the ACK1 information.

For example, when the metric information is the program time tPROG, the feedback module 340 calculates the actual program time tPROG of the write operation for the memory region in the NVM device 220 and transmits the calculated program time tPROG to the feature table 330 as the feedback information Fb. For example, when the feedback information Fb differs from the metric information prestored in the memory region of the feature table 300, the feedback module 340 updates the metric information prestored in the feature table 330 on the basis of the feedback information Fb.

The feedback module 340 generates the ACK2 information on the basis of the ACK1 information and notifies the host 100 or the controller 213 through the command packet manager 310 that the operation of the NVM device 220 has been finished.

Figure 6:
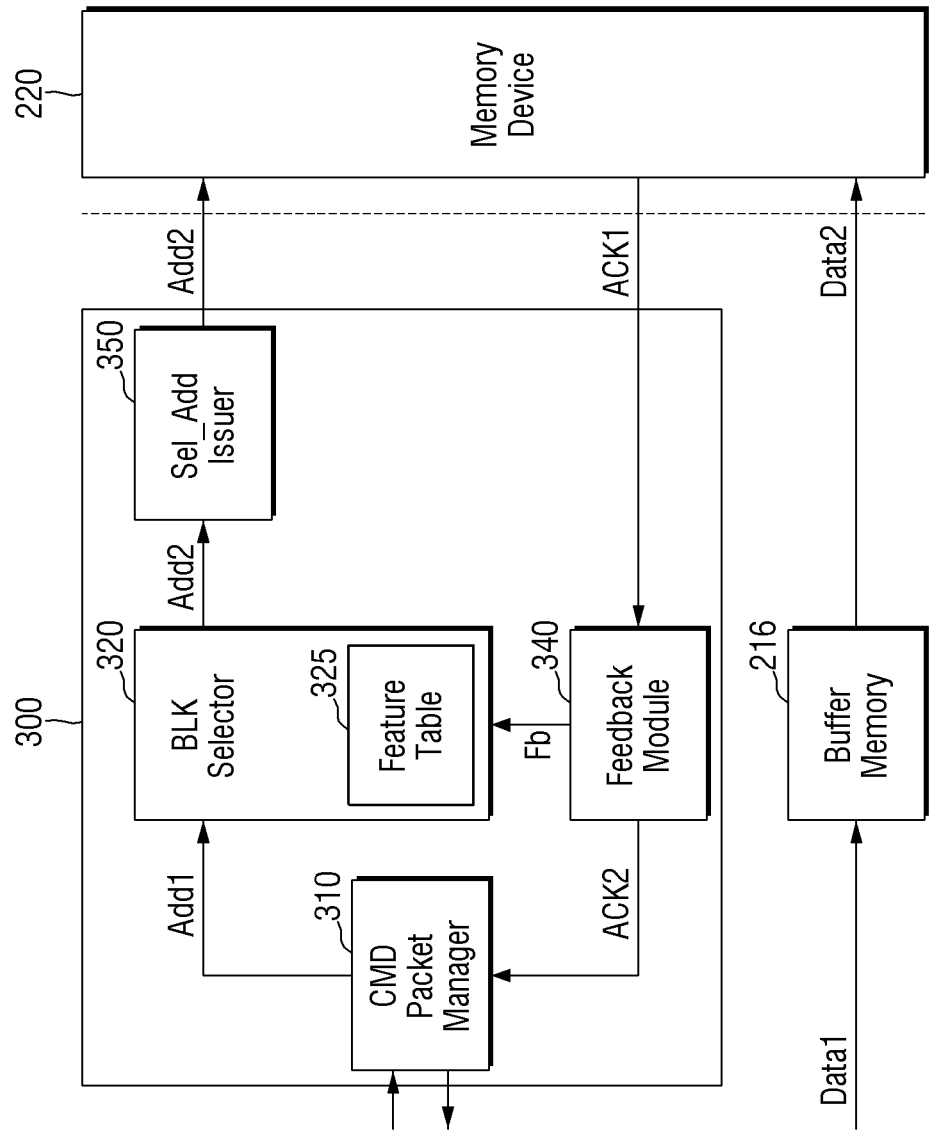
FIG. 6 is a block diagram showing a mitigator in detail according to some embodiments.

FIG. 6 is a block diagram showing a mitigator in detail according to some embodiments. Differences from FIG. 5 will be mainly described and overlapping descriptions will be omitted.

According to some embodiments, the feature table 330 may be implemented as a separate component from other components of the mitigator 300. The feature table 330 may be implemented as a separate writable memory device, for example, a register, a NVM, etc. In this case, the feedback module 340 may compare the feedback information Fb with metric information of the feature table 330 and updates the feature table 330 when the prestored metric information differs from the feedback information Fb.

According to some embodiments, the block selector 320 may include a feature table 325 as shown in FIG. 6. The feature table 325 may be implemented as a writable NVM embedded in the block selector 320. The feedback module 340 transmits the feedback information Fb based on the ACK1 information to the block selector 320. The block selector 320 compares the feedback information Fb with metric information of the feature table 325, for example, regarding each word line of a memory region and updates the feature table 325 when the prestored metric information differs from the feedback information Fb.

Figure 7:
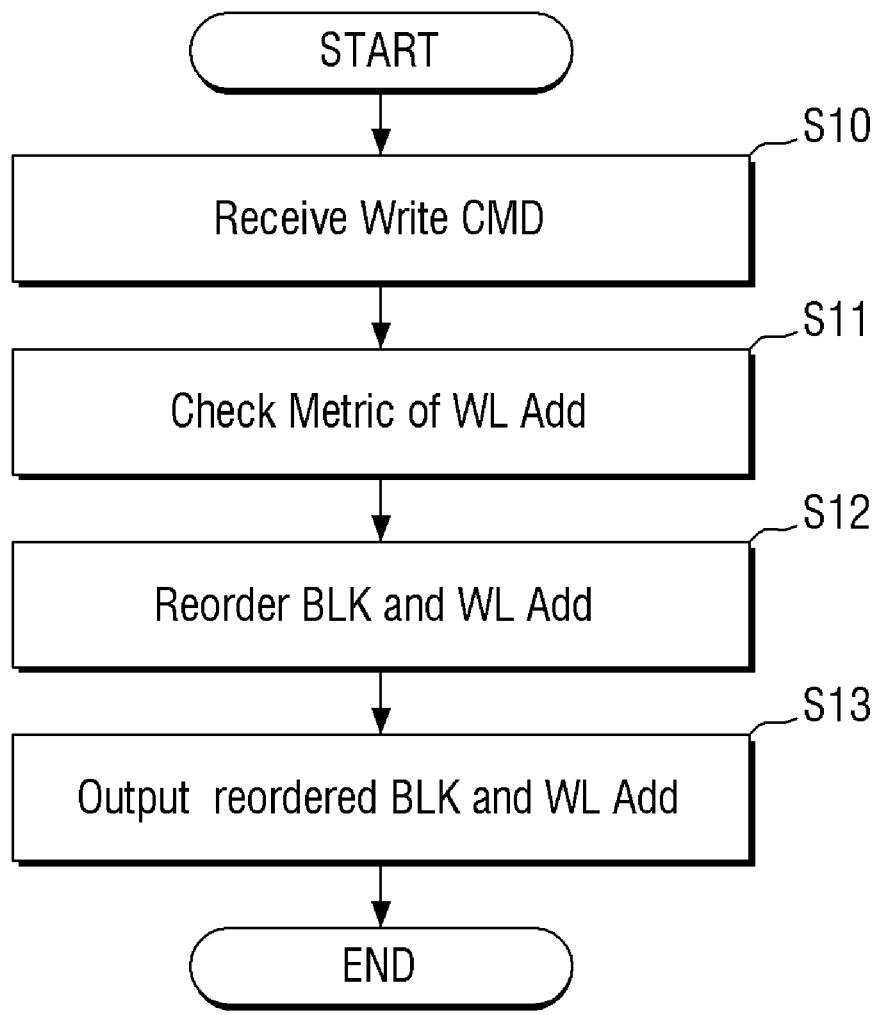
FIG. 7 is a flowchart illustrating an operating method of a storage controller according to some embodiments.

FIG. 7 is a flowchart illustrating an operating method of a storage controller according to some embodiments.

Referring to FIG. 7, the storage controller 210 receives a write command and data to be written from the host 100 (S10). The storage controller 210, for example, the mitigator 300, checks the write command to determine a memory region of the NVM device 220 to be accessed and checks metric information of each word line of the memory region (S11). According to some embodiments, the mitigator 300 extracts metric information of each word line stored in the feature table 330 or 325 and rearranges an order of accessing word lines and blocks on the basis of the extracted metric information (S12). For example, an order of accessing groups is rearranged on the basis of metric information to show even performance and the reordered blocks of groups or addresses of word lines are output (S13).

Figure 8:
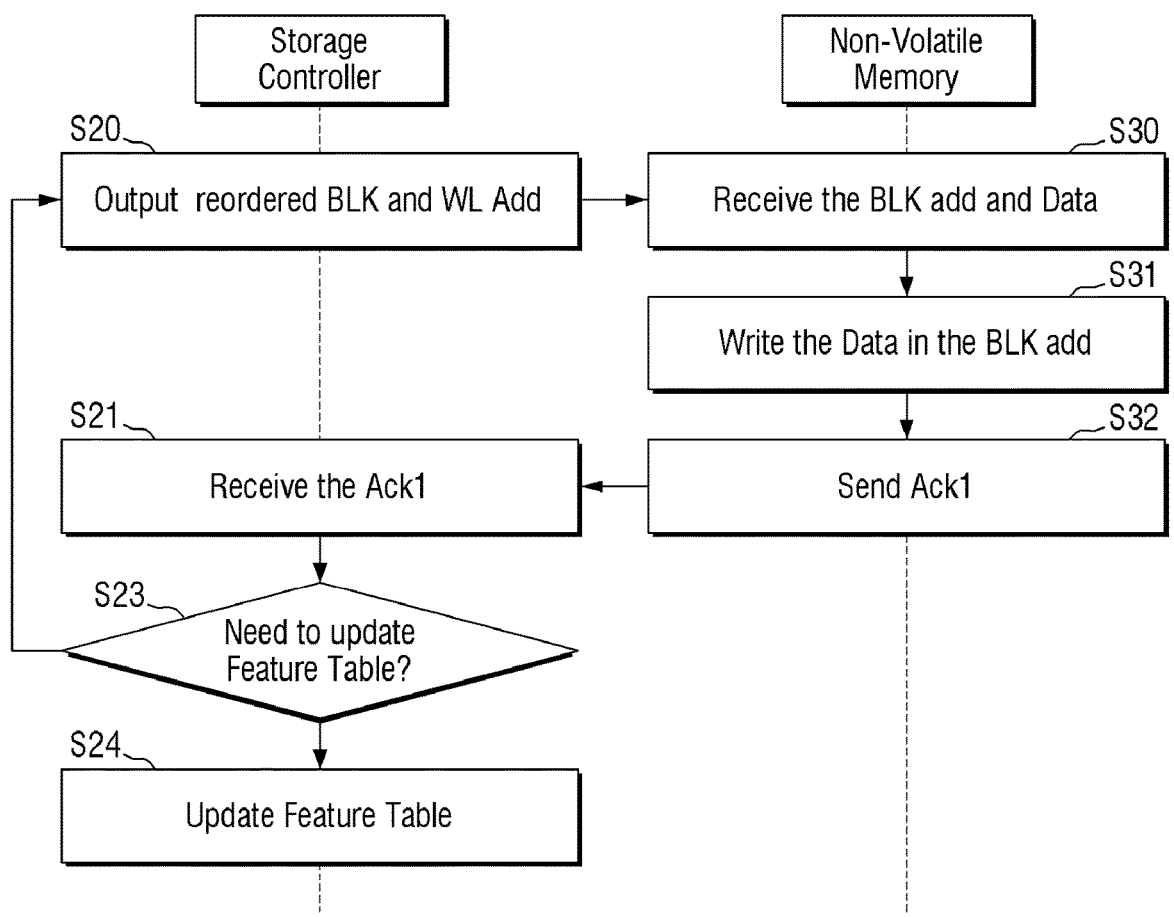
FIG. 8 is a flowchart illustrating an operating method of a storage controller according to some embodiments.

FIG. 8 is a flowchart illustrating an operating method of a storage controller according to some embodiments.

Referring to FIGS. 7 and 8, the storage controller 210 outputs reordered access addresses (S20). For example, the reordered addresses may be output according to each group and each group may include a block and word line address.

When the NVM device 220 receives the reordered block and word line addresses of groups (S30), the NVM device 220 writes data received from the storage controller 210 to the received addresses (S31). When the write operation is finished, the NVM device 220 outputs ACK1 information indicating that the write operation has been finished to the storage controller 210 (S32).

When the ACK1 information is received (S21), the storage controller 210 analyzes the ACK1 information as feedback information of the access addresses. For example, the storage controller 210 may analyze the time from a time point of transmitting the access addresses in S30 and data to a time point of receiving the ACK1 information in S21 as the feedback information. Alternatively, the NVM device 220 may transmit the ACK1 information including a program time actually taken for the write operation at the access addresses and the storage controller 210 may extract an actual program time tPROG from the ACK1 information.

The storage controller 210 compares the feedback information with metric information prestored in the feature table 330 to determine whether it is necessary to update the feature table 330 (S23). When the feedback information differs from the prestored metric information, the storage controller 210 may update metric information of the access addresses, for example, word-line and block addresses, with the feedback information (S24). On the other hand, when the feedback information is within a preset range of the prestored metric information, the storage controller 210 may output next reordered access information and then maintain the prestored metric information as it is until next ACK1 information is received.

Figure 9:
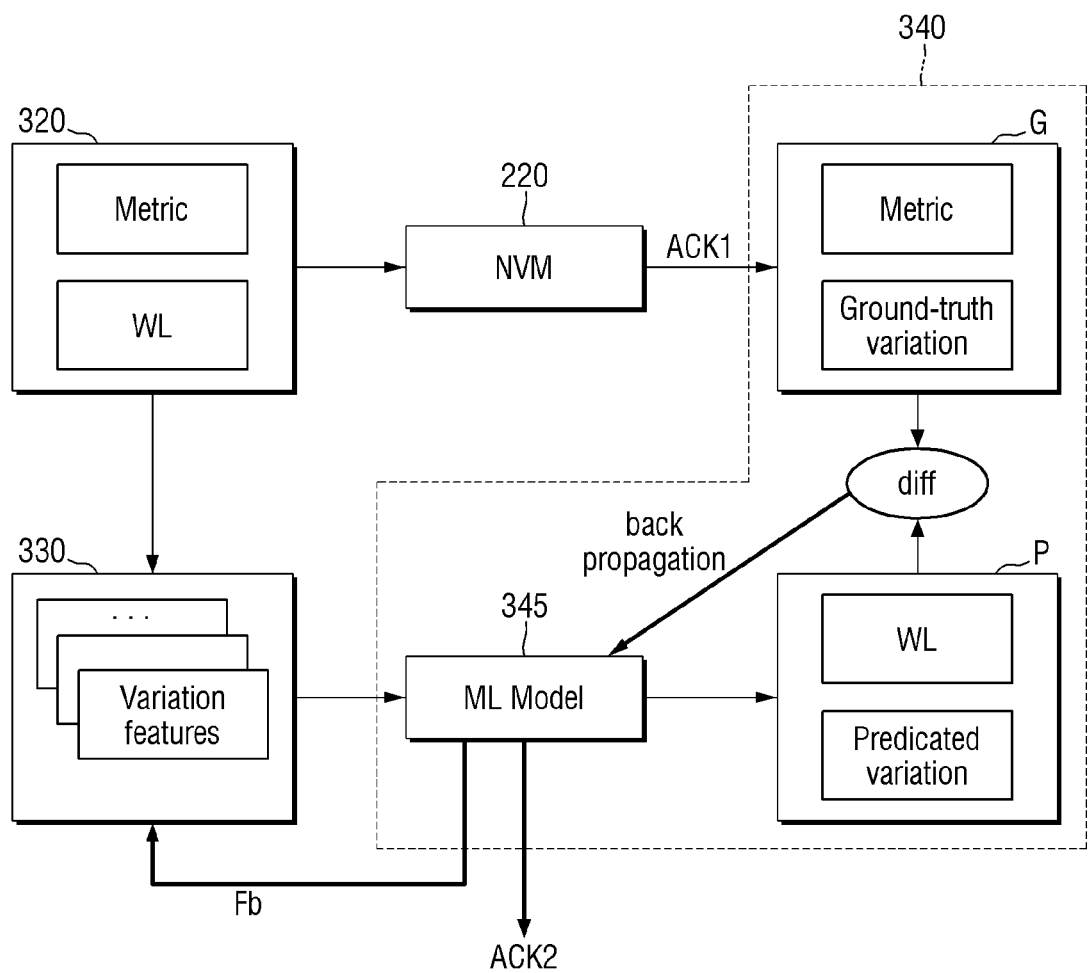
FIG. 9 is a block diagram showing a feedback module in detail according to some embodiments.

FIG. 9 is a block diagram showing a feedback module in detail according to some embodiments.

Referring to FIGS. 5 and 9, the feedback module 340 may include a machine learning model 345. The machine learning model 345 learns feature information of the NVM device 220 and calculates metric information corresponding to access addresses as learning results. The addresses include, for example, block addresses, word-line addresses, group information, chip location information, etc. The feature information may include at least one piece of metric information, for example, chip location information, block location information, the information tPROG on a program time taken for a data write operation, the information tR on a read time taken for a read operation, a P/E cycle, a process index, and wafer size information, which are features of the NVM device 220. According to some embodiments, the machine learning model 345 may separately learn and store the metric information of each group.

The feedback module 340 receives the ACK1 information from the NVM device 220. According to some embodiments, the feedback module 340 may receive or calculate metrics or actually measured values G of an accessed memory region from the ACK1 information. The feedback module 340 may calculate metrics and learned values P corresponding to the access addresses, for example, word lines, from feature information stored in the feature table 330.

According to some embodiments, the feedback module 340 compares the actually measured value G and the learned value P of a metric of the same address and propagates a difference value diff back to the machine learning model 345. The machine learning model 345 relearns grouping of the access addresses and the metric information on the basis of the difference values. The feedback information Fb calculated through the relearning is output to the feature table 330. The feature table 330 may update feature information of the access addresses (i.e., the group information and metric information) on the basis of the feedback information Fb.

According to some embodiments, when a preset P/E cycle is exceeded, the machine learning model 345 may relearn group information and metric information of the plurality of word lines to perform re-clustering. Alternatively, according to some embodiments, when the difference value diff between the actually measured value G and the learned value P exceeds a preset threshold, the machine learning model 345 may relearn group information and metric information of the plurality of word lines to perform re-clustering.

Re-clustering refers to an operation of repeating a corresponding operation (e.g., a write operation) on an access address a preset number of times (e.g., N times, N is a natural number equal to or greater than two) to newly measure metric information and clustering consecutive word lines having metric values within a preset standard deviation range into one group on the basis of the newly measured metric information. The feature table 330 may be updated with group information and metric information modified as re-clustering results.

Figure 10:
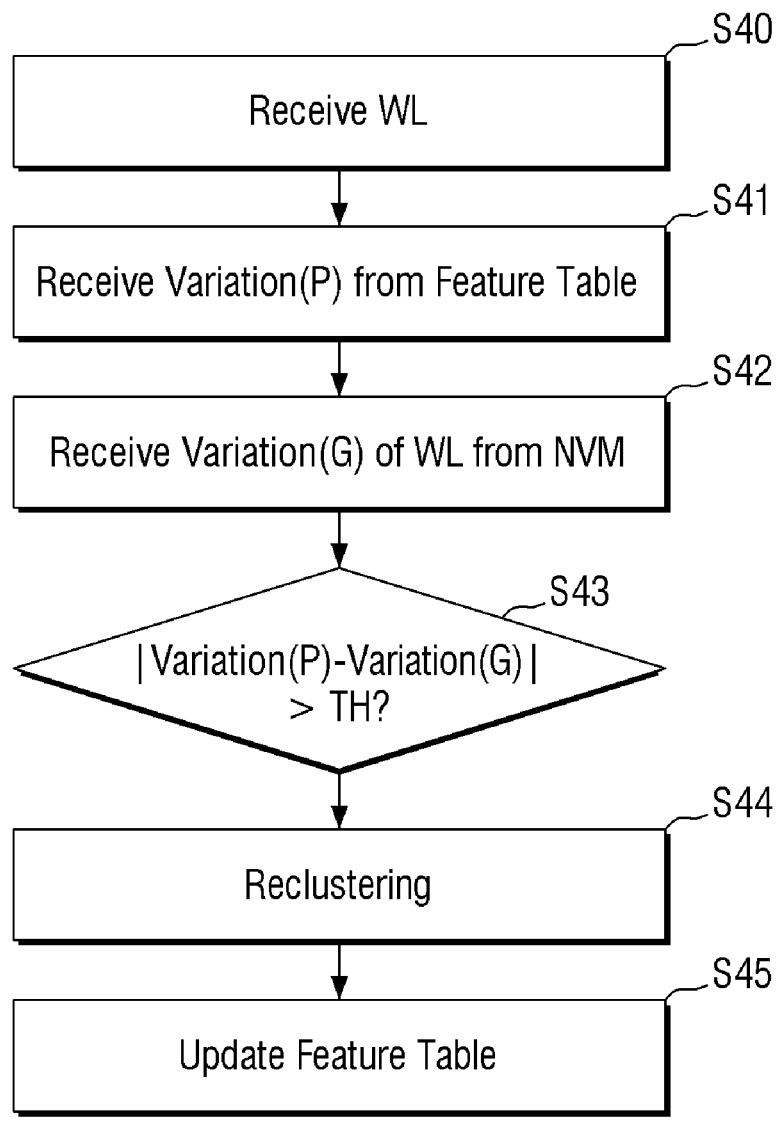
FIG. 10 is a flowchart illustrating an operating method of a storage controller according to some embodiments.

FIG. 10 is a flowchart illustrating an operating method of a storage controller according to some embodiments.

Referring to FIG. 10, when the storage controller 210 receives information on a word line to be accessed (S40), the feedback module 340 extracts feature information learned according to each word line, for example, learned metric information P, from the feature table 330 (S41). The NVM device 220 performs a write operation through the word line, and the feedback module 340 extracts actual feature information, for example, actual metric information G, from ACK1 information received from the NVM device 220 (S42). The feedback module 340 compares the learned metric information P stored in the feature table 330 with the actual metric information G, and when the difference exceeds a preset threshold (S43), the feedback module 340 re-clusters the word line (S44). Re-clustering will be described in detail with reference to FIG. 13 and the follow-up drawings.

As the re-clustering result, the feedback module 340 updates group information and the actual metric information G of the feature table 330 and stores the updated information (S45).

Figure 11:
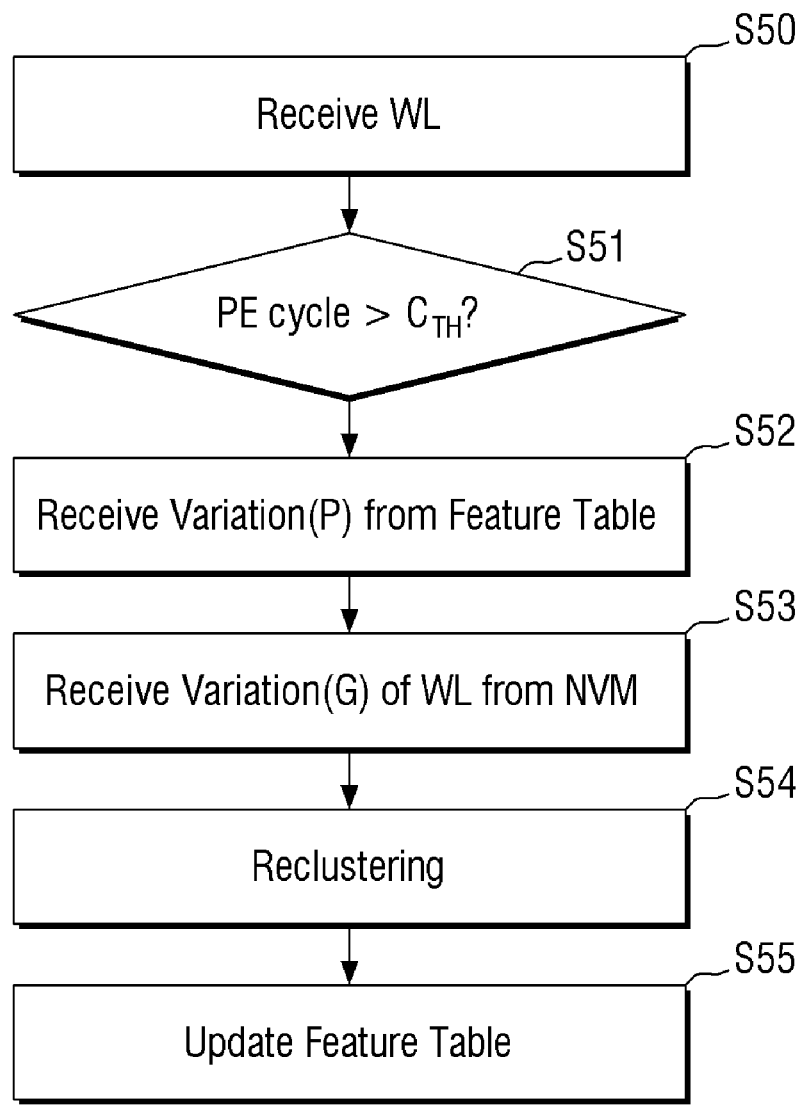
FIG. 11 is a flowchart illustrating an operating method of a storage controller according to some embodiments.

FIG. 11 is a flowchart illustrating an operating method of a storage controller according to some embodiments.

Referring to FIG. 11, when the storage controller 210 receives information on a word line to be accessed (S50), the feedback module 340 determines whether a P/E cycle of the word line reaches a preset threshold number of times $C_{TH}$ (S51) unlike FIG. 10. When the P/E cycle of the word line exceeds the preset threshold number of times $C_{TH}$, the feedback module 340 extracts feature information learned according to each word line, for example, learned metric information P, from the feature table 330 (S52). The NVM device 220 performs a write operation through the word line, and the feedback module 340 extracts actual feature information, for example, actual metric information G, from ACK1 information received from the NVM device 220 (S53).

The feedback module 340 re-clusters the word line (S54). Re-clustering will be described in detail with reference to FIG. 13 and the follow-up drawings. As the re-clustering result, the feedback module 340 updates group information and the actual metric information G of the feature table 330 and stores the updated information (S55)

Figure 12:
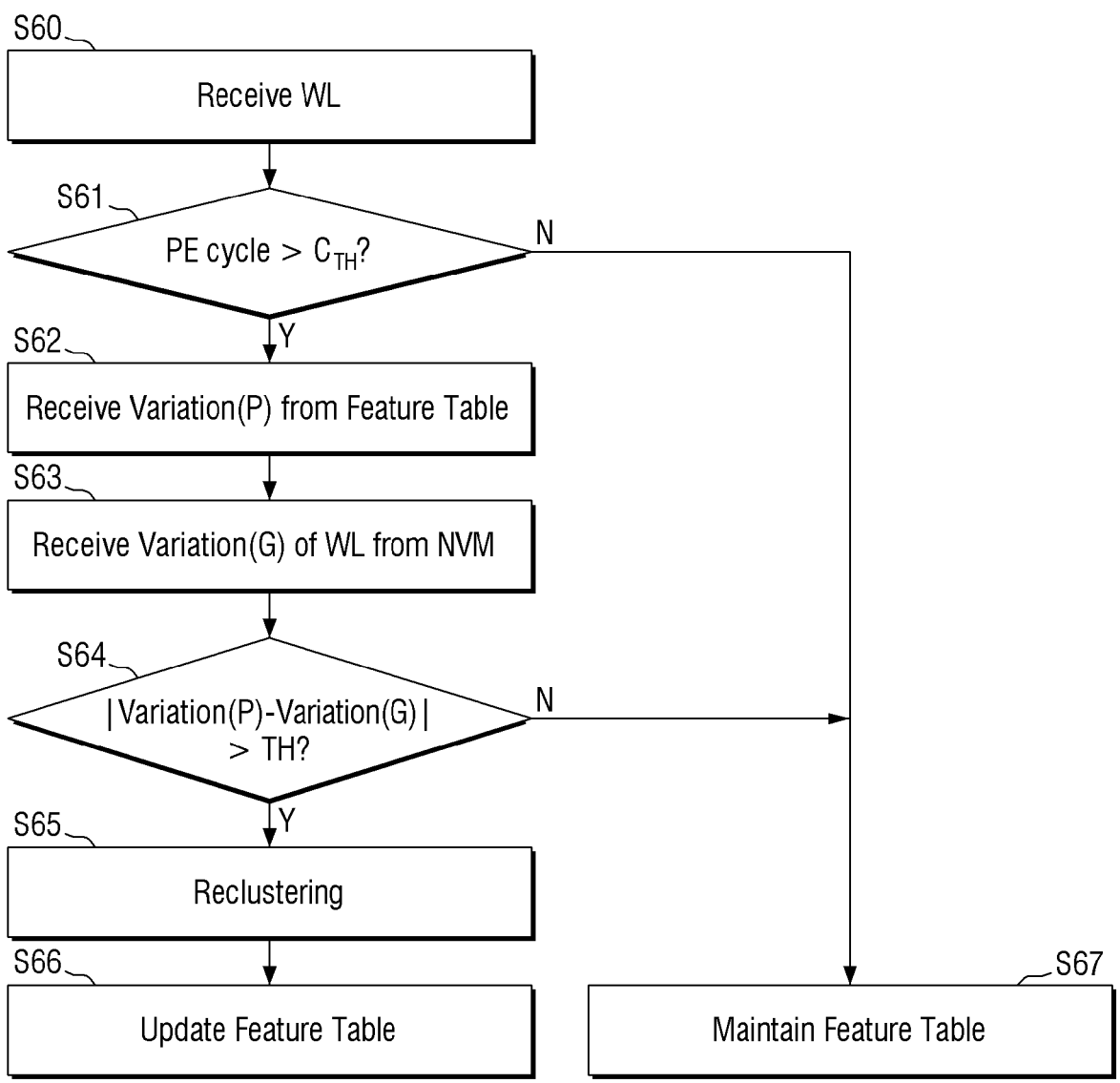
FIG. 12 is a flowchart illustrating an operating method of a storage controller according to some embodiments.

FIG. 12 is a flowchart illustrating an operating method of a storage controller according to some embodiments.

Referring to FIG. 12, when the storage controller 210 receives information on a word line to be accessed (S60), the feedback module 340 determines whether a P/E cycle of the word line reaches a preset threshold number of times $C_{TH}$ (S61) unlike FIG. 10. When the P/E cycle of the word line exceeds the preset threshold number of times $C_{TH}$, the feedback module 340 extracts feature information learned according to each word line, for example, learned metric information P, from the feature table 330 (S62). The NVM device 220 performs a write operation through the word line, and the feedback module 340 extracts actual feature information, for example, actual metric information G, from ACK1 information received from the NVM device 220 (S63). The feedback module 340 compares the learned metric information P stored in the feature table 330 with the actual metric information G, and when the difference exceeds a preset threshold TH (S64), the feedback module 340 re-clusters the word line (S65). As the re-clustering result, the feedback module 340 updates group information and the actual metric information G of the feature table 330 and stores the updated information (S66). Re-clustering will be described in detail with reference to FIG. 13 and the follow-up drawings.

On the other hand, when the difference between the learned metric information P stored in the feature table 330 and the actual metric information G is the preset threshold TH or less (S64), the feedback module 340 does not update the feature table 330 and maintains the stored metric information (S67).

Figure 13:
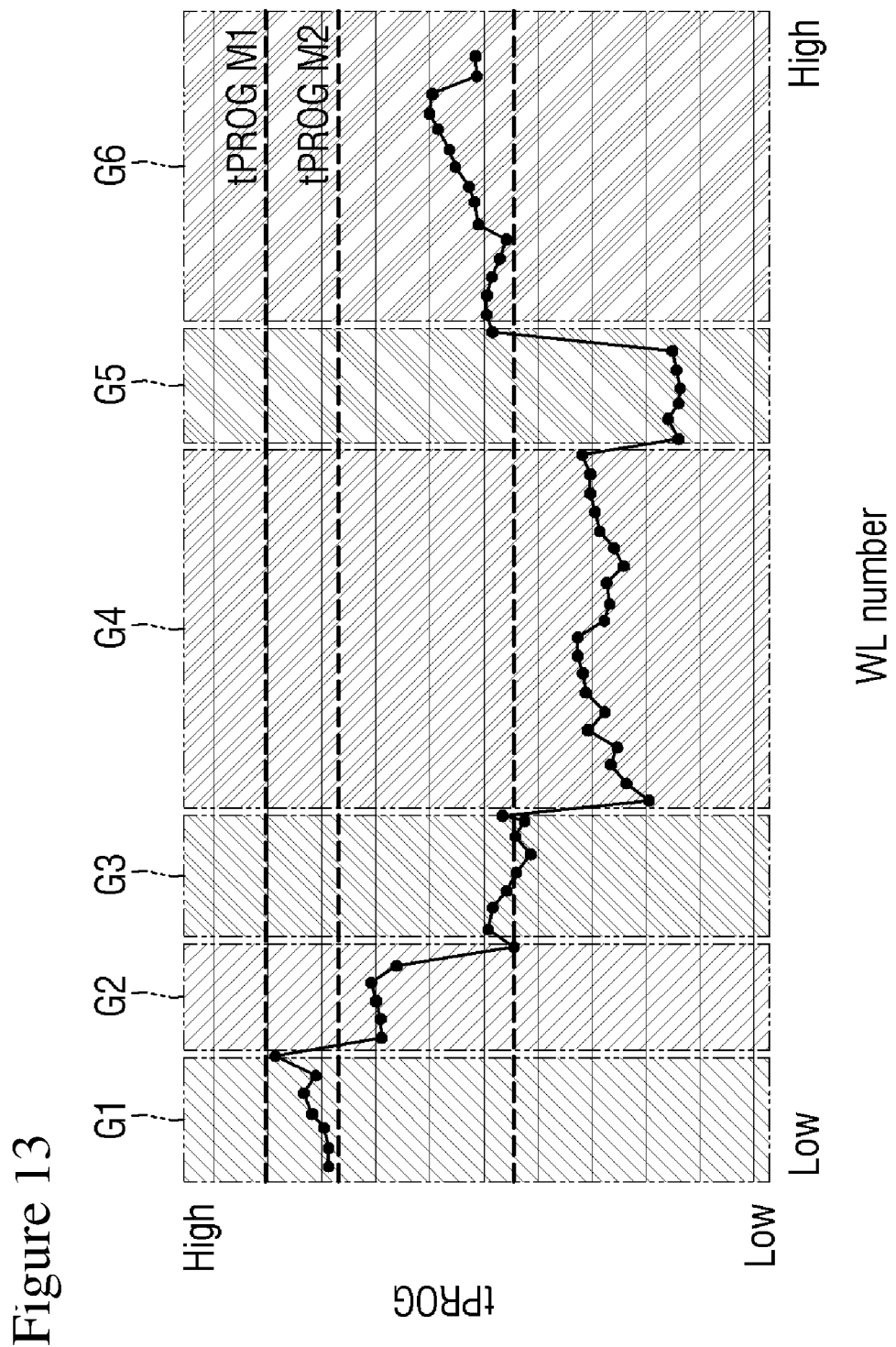
FIG. 13 is a graph showing a program time of each word line with respect to illustrating an operating method of a storage controller according to some embodiments.
Figure 14:
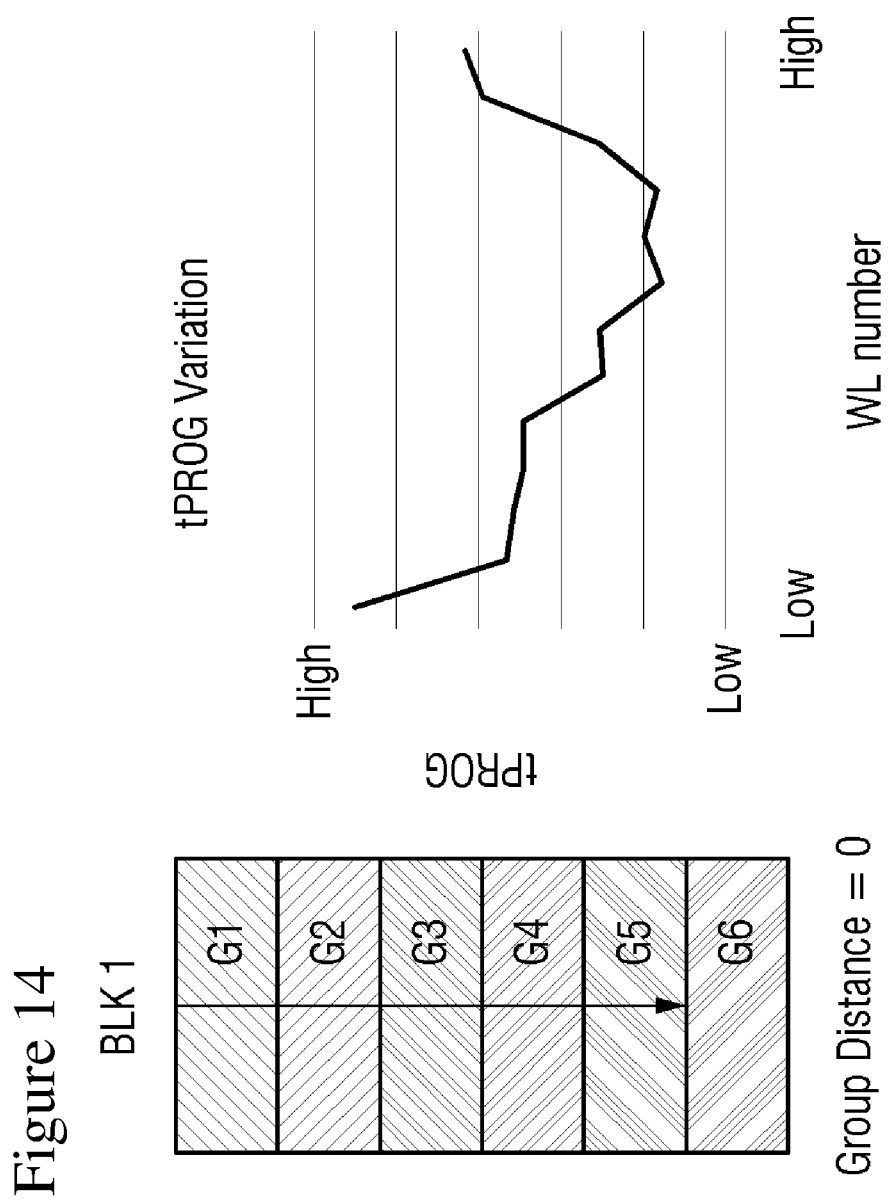
FIGS. 14 and 15 are conceptual diagrams illustrating an operating method of a storage controller according to some embodiments.
Figure 15:
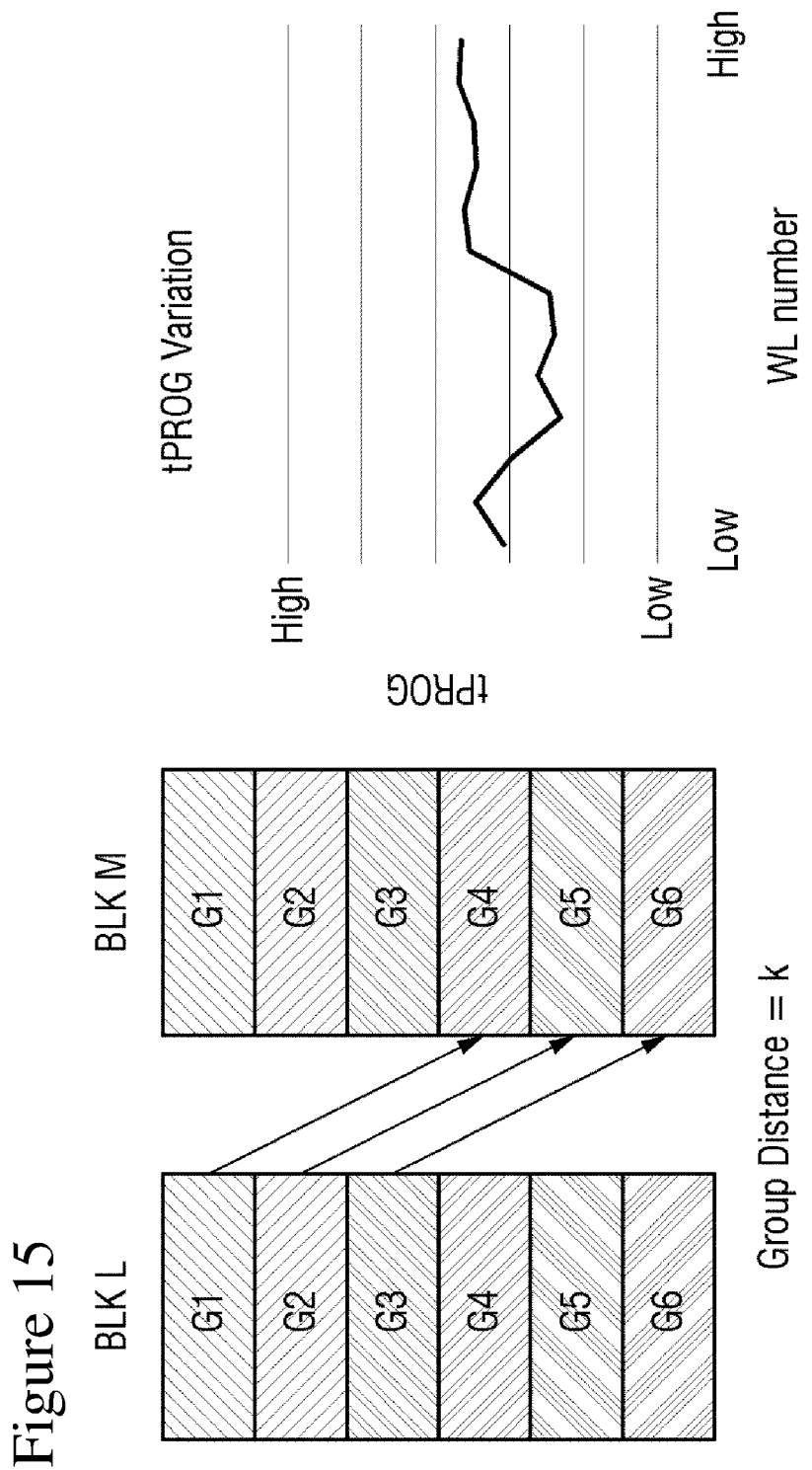

FIG. 13 is a graph showing a program time of each word line with respect to illustrating an operating method of a storage controller according to some embodiments, and FIGS. 14 and 15 are conceptual diagrams illustrating an operating method of a storage controller according to some embodiments. In FIGS. 13 to 15, the x axis represents numbers which correspond to a plurality of word lines included in one block and sequentially increase from left to right and the y axis represents a program time tPROG of each word line which sequentially increases from down to up.

Referring to FIG. 13, even when word lines are included in one block, a program time varies depending on locations of the word lines in the block. For example, program times tPROG of word lines in an area G1 have large difference from those of word lines in an area G4. A program time of a word line in the area G1 may be longer than that of a word line in the area G4. For example, a program time of the area G1 may have a certain range (tPROG M1 to tPROG M2) close to the maximum of program times of word lines included in a corresponding block. Such areas (e.g., the areas G1 to G6) may have different numbers of times being activated by memory access operations, for example, P/E cycles, or different program times (e.g., average program times) for process-related reasons.

The storage system 10 allocates a partial area of the buffer memory 216 to store data to be transmitted to the NVM device 220 on the basis of a section showing the slowest program speed, that is, a section (e.g., the area G1) showing the longest program time.

For example, when the storage controller 210 linearly allocates data in one block BLK1 to the buffer memory 216 according to word lines as shown in FIG. 14, data transmission from the buffer memory 216 to the NVM device 220 is limited by a section showing a long program time (areas of WL1 to WL3). To mitigate the limitation, it is necessary to fit data allocation to a section showing a long program time (the area G1 and the area G2), and thus the size of the buffer memory 216 in which data is stored increases.

Accordingly, in FIGS. 10, 11, and 12, re-clustering may be performed according to a metric feature of each word line (S44, S54, and S65) so that the groups have similar performance.

According to some embodiments, when a program time of each word line in each block is measured to form a group of consecutive word lines having similar program times and, thereafter, perform a write operation as shown in FIG. 15, it is possible to mitigate the program time limitation without increasing the buffer memory size.

According to some embodiments, word lines having similar program times and physically consecutive addresses may be clustered as a group and the clustered group may be used to access an NVM device and perform a write operation. The storage controller 210 may cluster word lines so that groups have similar performance and can perform a write operation with no limitation on the program time even without increasing the buffer memory size.

A first area G1 of a first block BLK L and a second area G4 are clustered into a first group to access the NVM device 220. For example, in FIG. 15, the group distance between the first area G1 and the second area G4 may be 3 (G4-G1).

When the area G1 of the first block BLK L has a low program speed and the area G4 of a second block BLK M has a high program speed, the area G1 of the first block BLK L and the area G4 of the second block BLK M may be clustered into the first group and an area G2 of the first block BLK L and an area G5 of the second block BLK M may be clustered into a second group. In other words, when the storage controller 210 clusters and accesses word lines so that groups have similar performance, it is possible to have a stable program time without a significant change as shown in the program time graph of FIG. 15 in comparison with the program time graph of FIG. 14, and thus the buffer memory 216 and the NVM device 220 can stably operate.

Figure 16:
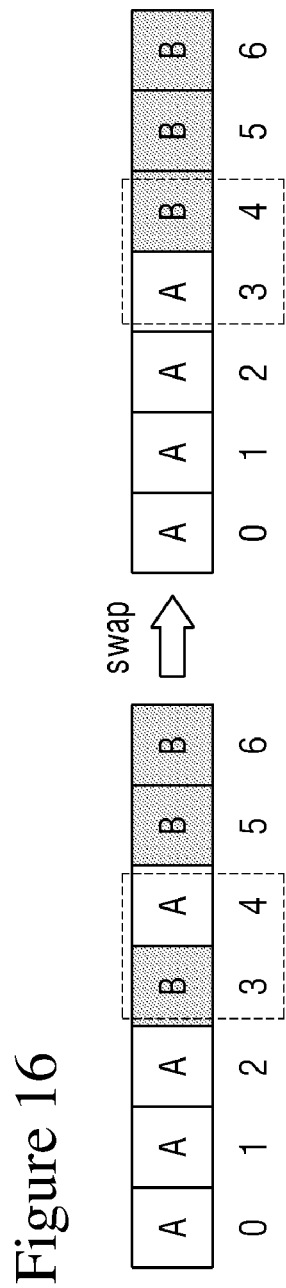
FIG. 16 is a conceptual diagram illustrating an operating method of a storage controller according to some embodiments.

FIG. 16 is a conceptual diagram illustrating an operating method of a storage controller according to some embodiments.

In an example shown in the drawing, word lines WL0, WL1, WL2, WL3, WL4, WL5, and WL6 are consecutively disposed word lines. The storage controller performs re-clustering on the basis of actual metric information P of each word line to reset groups such that the word lines WL0, WL1, WL2, and WL4 may be clustered into a group A and the word lines WL3, WL5, and WL6 may be clustered into a group B. The NVM device 220 accesses physically consecutive addresses and does not non-consecutively access the two word lines WL3 and WL4 shown in the initial re-clustering result. Like this, when a non-consecutive word line is included in one group after re-clustering, the re-clustering result may be modified through a swap.

In the example shown in the drawing, when the word lines WL3 and WL4 are respectively determined to be the group B and the group A as the re-clustering result, the group B of the word line WL3 may be swapped with the group A of the word line WL 4.

Figure 17:
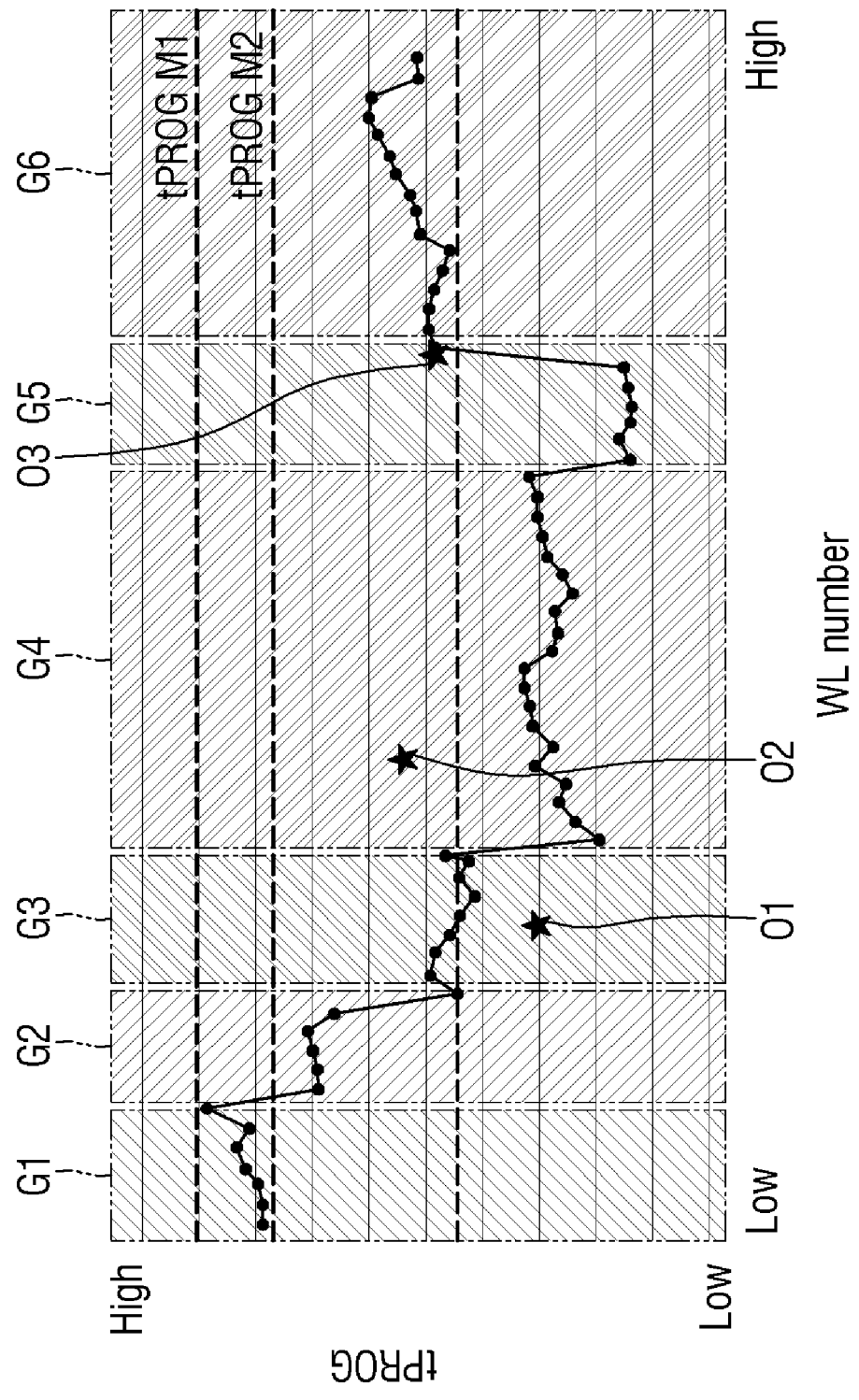
FIG. 17 is a graph illustrating an operating method of a storage controller according to some embodiments.

FIG. 17 is a graph illustrating an operating method of a storage controller according to some embodiments. In FIG. 17, the x axis represents numbers which correspond to a plurality of word lines included in one block and sequentially increase from left to right, and the y axis represents a program time tPROG of each word line which sequentially increases from down to up.

Referring to FIG. 17, the storage controller 210 may cluster consecutive word lines having similar metric values (e.g., program times) into one group. However, even consecutive word lines may include an outlier which is a specific word line having a significantly different metric value from other adjacent word lines. For example, a group G3, a group G4, and a group G5 may have outlier program times 01, 02, and 03, respectively.

In a re-clustering operation, the storage controller 210 may set groups to have similar performance by excluding outliers. According to some embodiments, the storage controller 210 may detect an outlier by comparing the average metric value (e.g., a program time) of a preset number (e.g., j which is a natural number equal to or greater than three) with a metric value of each word line. According to some embodiments, a word line having an outlier may be reset to an average metric value of adjacent word lines and thus may be re-clustered into a group.

Figure 18:
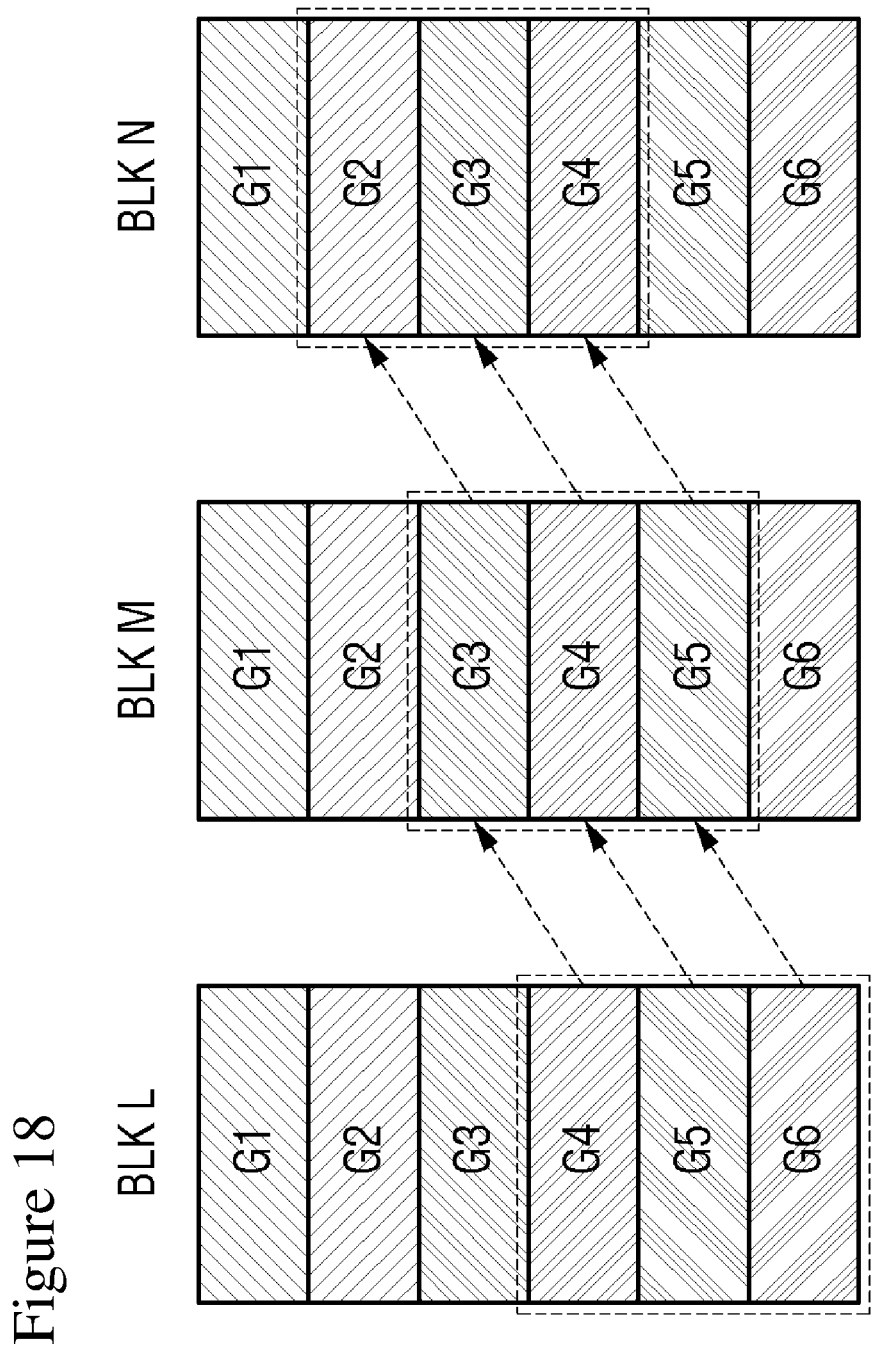
FIG. 18 is a conceptual diagram illustrating an operating method of a storage controller according to some embodiments.

FIG. 18 is a conceptual diagram illustrating an operating method of a storage controller according to some embodiments.

Referring to FIG. 18, the storage controller 210 may perform a write operation on the NVM device 220 in units of clustered groups. In an example shown in the drawing, areas G3, G4, and G5 of a second block BLK M are interleaved with areas G4, G5, and G6 of a first block BLK L for writing, and areas G2, G3, and G4 of a third block BLK N are interleaved with the areas G3, G4, and G5 of the second block BLK M for writing. In this way, when an alternating group writing operation is performed, it is possible to improve quality of service (QOS) with even performance.

Also, the storage controller 210 adaptively reflects feature information which varies depending on the operating environment of the NVM device 220 through feedback to perform re-clustering and, thus, the maximum buffer usage of the buffer memory 216 can be minimized.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

Although exemplary embodiments of the present disclosure have been described above with reference to the accompanying drawings, it will be understood by those of ordinary skill in the art that the present disclosure can be implemented in other specific forms without changing the technical spirit or essential characteristics of the present disclosure. Therefore, the above-described embodiments should be considered as illustrative rather than restrictive in all aspects.

What is claimed is:

1. A storage system comprising:
   a non-volatile memory (NVM) device including a memory cell array; and
   a storage controller configured to receive a write command and data from a host and control the NVM device to write the data in the memory cell array, wherein the storage controller is configured to:
   determine a memory region of the memory cell array in which the data will be written,
   cluster a plurality of word lines of the memory region into a plurality of groups based on feature information of the plurality of word lines,
   rearrange an access order of the plurality of groups as a rearranged order based on the feature information, and
   access the plurality of word lines in the rearranged order to write the data in the memory region in a write operation.

2. The storage system of claim 1, wherein, in the feature information of the plurality of word lines, metric information of the plurality of word lines is stored in a feature table.

3. The storage system of claim 2, wherein the storage controller is configured to:
   update the metric information of the plurality of word lines based on acknowledgment (ACK) information received from the NVM device after the write operation, and store the updated metric information of the plurality of word lines in the feature table.

4. The storage system of claim 3, wherein the storage controller is configured to update the metric information based on a program/erase cycle of the plurality of word lines exceeding a preset number of times.

5. The storage system of claim 3, wherein the storage controller is configured to update the metric information based on a difference between learned metric information stored in the feature table and actual metric information calculated from the ACK information exceeding a preset threshold.

6. The storage system of claim 1, wherein the storage controller is configured to cluster k (k is a natural number equal to or greater than 3) word lines, of the plurality of word lines, having physically consecutive addresses into a first group of the plurality of groups.

7. The storage system of claim 6, wherein each of the k word lines has a metric value within a standard deviation range that is preset based on an average metric value of the k word lines.

8. The storage system of claim 7, wherein the storage controller is configured to exclude a word line from the first group as an outlier based on the average metric value.

9. A storage system comprising:
a non-volatile memory (NVM) device including a memory cell array connected to a plurality of word lines; and
a storage controller including a mitigator configured to:
receive a write command and data from a host,
rearrange an order of accessing, in units of groups, word lines belonging to a memory region in which the data will be written as a rearranged order of groups,
output word line addresses in the rearranged order of groups, and
control the NVM device to write the data, wherein the mitigator comprises:
a feature table configured to store metric information and group information of each of the plurality of word lines,
a block selector configured to select metric information and group information corresponding to the word lines belonging to the memory region and rearrange, as the rearranged order of groups, the order of accessing the word lines belonging to the memory region based on the metric information, and
a selection address issuer configured to issue addresses of the rearranged order of groups to the NVM device.

10. The storage system of claim 9, wherein each of the groups includes M (M is a natural number equal to or greater than 3) word lines having consecutive physical addresses and similar metric values.

11. The storage system of claim 9, wherein, in the feature table, the metric information of each of the plurality of word lines is based on learning feature information of the NVM device.

12. The storage system of claim 11, wherein the feature information of the NVM device comprises at least one of chip location information, block location information, program time information for a data write operation, read time information for a read operation, a program/erase cycle, a process index, or wafer size information.

13. The storage system of claim 11, wherein the group information indicates into which group, of N groups, each word line of the plurality of word lines belongs, where N is a natural number equal to or greater than two.

14. The storage system of claim 11, wherein the storage controller further includes a feedback module configured to receive acknowledgment (ACK) information after a write operation of the NVM device is finished and update the feature table using actual metric information of an accessed word line as feedback information.

15. The storage system of claim 14, wherein the feedback module includes a machine learning model configured to relearn the group information and the metric information based on a difference between the stored metric information and the actual metric information regarding the accessed word line.

16. An operating method of a storage controller, the method comprising:
receiving a write command and data from a host;
extracting, as extracted metric information, prestored metric information corresponding to a word line for a memory region of a non-volatile memory (NVM) device in which the data will be written;
accessing the memory region in an order of a plurality of word lines, wherein the plurality of word lines are rearranged in units of groups based on the extracted metric information, to write the data; and
based on receiving acknowledgment (ACK) information from the NVM device, calculating actual metric information from the ACK information, and updating the prestored metric information based on the actual metric information.

17. The operating method of claim 16, wherein updating the prestored metric information comprises, based on a difference between the prestored metric information and the actual metric information exceeding a preset threshold, re-clustering the plurality of word lines based on machine learning.

18. The operating method of claim 16, wherein updating the prestored metric information comprises, based on a preset program/erase cycle being exceeded, re-clustering the plurality of word lines.

19. The operating method of claim 16, wherein each of the groups includes k (k is a natural number equal to or greater than 3) physically consecutive word lines each having a metric value within a preset standard deviation range.

20. The operating method of claim 19, comprising excluding a first word line of the NVM device from inclusion in one of the groups as an outlier based on an average metric value.

* * * * *